United States Patent [19]

Hasegawa et al.

[11] Patent Number: 5,322,593
[45] Date of Patent: Jun. 21, 1994

[54] METHOD FOR MANUFACTURING POLYIMIDE MULTILAYER WIRING SUBSTRATE

[75] Inventors: Shinichi Hasegawa; Sakae Yokokawa, both of Tokyo, Japan

[73] Assignee: NEC Corporation, Tokyo, Japan

[21] Appl. No.: 979,795

[22] Filed: Nov. 20, 1992

[30] Foreign Application Priority Data

Nov. 21, 1991 [JP] Japan .................. 3-305943
Aug. 19, 1992 [JP] Japan .................. 4-219512

[51] Int. Cl.⁵ .................. B44C 1/22; B29C 37/00; C23F 1/00
[52] U.S. Cl. .................. 156/633; 156/634; 156/645; 156/655; 156/656; 156/901
[58] Field of Search .............. 156/629, 631, 633, 634, 156/645, 655, 656, 659.1, 668, 901, 902; 29/846, 852, 874; 428/209, 901; 361/412, 414

[56] References Cited

U.S. PATENT DOCUMENTS 4,622,058 11/1986 Leary-Renick et al. ....... 156/663 X
4,970,106 11/1990 DiStefano et al. .............. 156/634 X

OTHER PUBLICATIONS

"Polyimide-Ceramic Substrate for Supercomputer Packaging," Materials Research Society Symposium Proceedings, vol. 167, 1990, pp. 33–42.
"High Performance Packaging Technology for Supercomputers," IEICE Transactions, vol. E 74, No. 8, Aug. 1991, pp. 2331–2336.

*Primary Examiner*—William A. Powell
*Attorney, Agent, or Firm*—Sughrue, Mion, Zinn, Macpeak & Seas

[57] ABSTRACT

A layered structure comprising wiring layers and polyimide layers is formed on a ceramics board and a layered structure comprising wiring layers and polyimide layers is formed on an aluminum board. Both the structures are bonded together through adhesives to bring metal bumps formed on the former structure into electric contact with metal bumps formed on the surface of the latter structure and thereafter the aluminum board is removed.

5 Claims, 29 Drawing Sheets

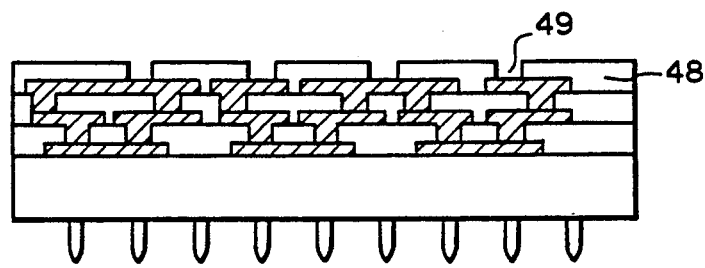
Fig. 12(d)
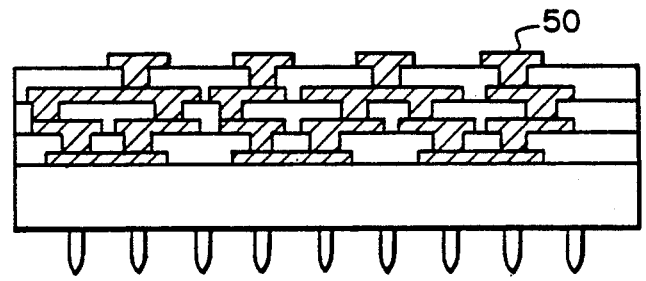
Fig. 12(e)
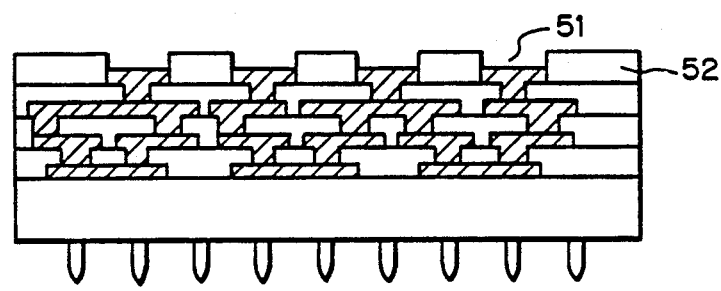
Fig. 12(f)
Fig. 13
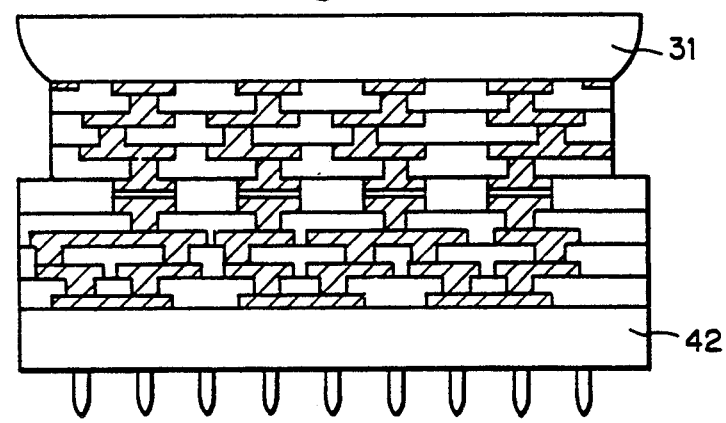

METHOD FOR MANUFACTURING POLYIMIDE MULTILAYER WIRING SUBSTRATE

BACKGROUND OF THE INVENTION

1. Field of the Invention

This invention relates to a polyimide multilayer wiring substrate, wherein polyimide resin is employed as interlaminar insulation when multilayer wiring layer is formed on a ceramic board, and a method for manufacturing the same.

2. Description of the Related Art

Multilayer printed wiring substrates have conventionally been used as wiring substrates for carrying LSI chips thereon. A multilayer printed wiring substrate is constructed using a copper plated layered plate as a core member and using a prepreg as a bonding agent for the core member, and the core members and the prepregs are layered alternately, integrally with each other using a heat press. Electrical connection between the layered plates is established by forming, after the core members and prepreg are formed into a single structure, through-holes by drilling and thereafter plating the inner walls of the through-holes with copper.

Recently, multilayer wiring substrates, in which a polyimide resin is employed as interlaminar insulation when multilayer wiring layer is formed on a ceramic board, have been used for wiring substrates for use in large computers, which require a wiring density higher than that of multilayer printed wiring layers. For manufacturing a polyimide-ceramic multilayer wiring substrate, a polyimide multilayer wiring layer formed by repeating a series of steps comprising a polyimide resin insulation layer forming step, in which polyimide precursor varnish is applied to a ceramic board and dried to form a coated film, and viaholes are formed in said film, and a wiring layer forming step, in which photolithography, vacuum deposition and plating are used.

Aside from the above-mentioned method, there is a method in which wiring patterns are first formed on polyimide sheets and then the polyimide sheets are successively positioned and layered under pressure on a ceramic board to form a multilayer wiring substrate. Since a signal layer is formed individually, sheets free from defects can be selectively laminated, resulting in improved manufacturing yield as compared to the successive layering method as described above.

In the multilayer printed wiring substrate described above, since electrical connection between layered plates is established by means of through-holes formed therein by drilling, fine through-holes can not be formed, and hence the number of wirings which can be formed between the through-holes is limited. Further, one through-hole is required for the connection in one layered plate, and as the number of layers increases, the signal wiring capacity decreases, thereby leading to a drawback that it is difficult to form a multilayer printed wiring substrate having a high wiring density.

Meanwhile, a polyimide-ceramic multilayer wiring substrate which has been developed recently in order to offset the drawback of a conventional multilayer printed wiring substrate described above, requires repetition of the steps including a step of applying polyimide precursor varnish to a ceramic board, a drying step, a step of forming viaholes and a curing step, in which the number of repetition is equal to the number of polyimide insulation layers. Consequently, a very long period of time is required for the layering step for a multilayer wiring substrate. Further, since the step of forming a polyimide insulation layer is performed repetitively, there is another drawback that thermal stress in the curing step is imparted many times to the polyimide resin at lower layers of the multilayer wiring substrate layer, which deteriorates the polyimide resin. The polyimide multilayer wiring substrate has a further drawback that, since they are formed by a sequential layering method, it is difficult to enhance manufacturing yield.

Also the method for layering sheets one by one, which has been developed as a method to enhance the manufacturing yield, still has the drawbacks that, since layering is successively performed under pressure for each layer, as the number of layers increases, the thermal stress imparted to the polyimide resin of lower layers increases and the deterioration of the polyimide resin occurs mainly at an earlier stage and that a great number of days are required to manufacture a substrate.

In order to overcome the drawbacks described above, a yet further method has been proposed wherein a polyimide multilayer wiring substrate is formed by successively stacking a plurality of blocks each consisting of a layered structure including a plurality of wiring layers and dissolving, each time one block is stacked, a base material such as aluminum using a solution such as hydrochloric acid as occasion calls. The method, however, still has a problem that wirings are invaded by the liquid for dissolving the base material.

SUMMARY OF THE INVENTION

It is an object of the present invention to provide a polyimide multilayer wiring substrate and a manufacturing method by which a polyimide multilayer wiring substrate of a high multilayer wiring density can be formed in a very short manufacturing time as compared with a conventional sequential layering method.

In order to attain the object, according to an aspect of the present invention, there is provided a method for manufacturing a polyimide multilayer wiring substrate, including the steps of:

(1) forming a first layered structure consisting of one or more wiring layers and one or more polyimide layers as an interlayer insulating material on a first board having an external and internal surface, wherein said external surface has high adhesiveness to polyimide and said internal surface has negligible adhesiveness to polyimide, (2) forming on a second board a second layered structure consisting of one or more wiring layers and one or more polyimide layers as an interlayer insulating material, (3) aligning metal bumps, which are formed on the surface of the first layered structure and electrically connected to the wirings in the first layered structure, with metal bumps, which are formed on the surface of the second layered structure and electrically connected to the wirings in the second layered structure, pressing an adhesive layer formed on the surface of the first layered structure against an adhesive layer formed on the surface of the second layered structure and heating both the adhesive layers to bond said layers to each other, thereby establishing electric connection between the metal bumps on the first and second layered structures, (4) separating the external surface of the first layered structure to remove the first substrate, and (5) forming via holes in the polyimide layer exposed at the fourth step.

According to another aspect of the present invention, there is provided a method for manufacturing a polyimide multilayer wiring substrate, including the steps of:

(1) forming a first layered structure, wherein an uppermost layer of polyimide multilayer wiring layers formed by stacking at least one wiring layer and at least on polyimide layer, as interlayer insulating material on a board, is made of polyimide resin, and a plurality of first metal electrodes the provided in said uppermost layer so as to make electric contact with said wiring layer, (2) forming a second layered structure, wherein an uppermost layer of polyimide multilayer wiring layers formed by stacking at least one wiring layer and at least one polyimide layer, as interlayer insulating material, on a flat hard board is an adhesive-agent layer, and a plurality of second metal electrodes are provided in said uppermost layer so as to make electric contact with said wiring layer, (3) superposing the uppermost layer of the first layered structure on the uppermost layer of the second layered structure, the first metal electrodes and the second metal electrodes being aligned with each other, thereafter pressing and heating both the structures to bond both the uppermost layers to each other, thereby joining said first and second metal electrodes to electrically connect said first and second layered structures, (4) partially removing said flat hard board of second layered structure so as to leave behind a thin board on said structure, dissolving and removing said thin board with etching liquid to expose a polyimide layer, farming viaholes and metal electrodes in contact with internal wiring layer in said polyimide layer, and further superposing another second layered structure on said exposed layer in succession.

According to a further aspect of the invention there is provided a polyimide multilayer wiring substrate comprising:

A first layered structure, wherein an uppermost layer of polyimide multilayer wiring layers formed by stacking at least one wiring layer and at least one polyimide layer, as interlayer insulating material, on a board is made of polyimide resin, and a plurality of first metal electrodes are provided in said uppermost layer so as to make electric contact with said wiring layer, and A plurality of second layered structure, wherein an uppermost layer of polyimide multilayer wiring layers formed by stacking at least one wiring layer and at least one polyimide layer, as interlayer insulating material, on a flat board is an adhesive agent layer, and a plurality of second metal electrodes are provided in said uppermost layer so as to make contact with said wiring layer, Wherein, one of said second layered structure is superposed on the first layered structure to bond the uppermost layers of both the structures to each other, thereby joining said first and second metal electrodes together to electrically connect said on of the second layered structure with said first layered structure, and said flat hard board of said second layered structure is removed to expose a polyimide layer so that viaholes and metal electrodes connected to internal wirings are formed in said polyimide layer and thereafter another second layered structure is superposed on said polyimide layer in succession.

Further said flat board may be of aluminum, alumina, silicon or glass and said substrate may be either a substrate of ceramics, glass ceramics or hard organic resins, or a metal plate covered with insulation material. The uppermost layer of at least one of said first and second layered structures may be an adhesion layer comprising films of melt-setting maleimide resin or melt fluorine.

In a polyimide multilayer wiring substrate with polyimide multilayer wiring layer according to the present invention, an adhesive agent layer of a polyimide multilayer wiring layer formed from polyimide multilayer wirings and the surface of a polyimide wiring layer formed on a ceramic board are aligned and then pressed and heated to bond said adhesive agent layer to said surface of polyimide wiring layer and also to bond metal bumps on each of the uppermost surfaces, with the result that layered structures are electrically connected together. A flat plate of a supporting board which was used to form the polyimide multilayer wiring layer is partially removed in a direction parallel to the surface of said plate and the remaining flat plate is dissolved and removed to expose the uppermost polyimide layer using etching liquid to superpose and bond by heat another polyimide multilayer wiring layer to the exposed polyimide layer. In this manner, a multilayer substrate can be manufactured with ease.

The above and other objects, features, and advantages of the present invention will become apparent from the following description referring to the accompanying drawings which illustrate an example of a preferred embodiment of the present invention.

BRIEF DESCRIPTION OF THE DRAWINGS

FIGS. 13-18 illustrate manufacturing steps in accordance with a second preferred embodiment;

DETAILED DESCRIPTION OF THE PREFERRED EMBODIMENTS

Embodiments of the present invention are described subsequently with reference to the drawings.

FIGS. 1 to 12 illustrate a first embodiment of a method for manufacturing a polyimide multilayer wiring substrate of the present invention in the order of steps.

In a polyimide multilayer wiring substrate 1 according to the present embodiment, the thickness of a wiring inter-layer insulation layer is 20 μm; the width of a signal wiring is 25 μm; and the thickness of a signal line film is 10 μm, and a photosensitive polyimide having a glass transition point is employed as the polyimide resin and gold is employed as the wiring metal.

First, a set of signal wiring layers and a grounding and connecting layer are formed on a flat board of aluminum (hereinafter referred to simply as aluminum flat board) by the following method.

Figure 1A:
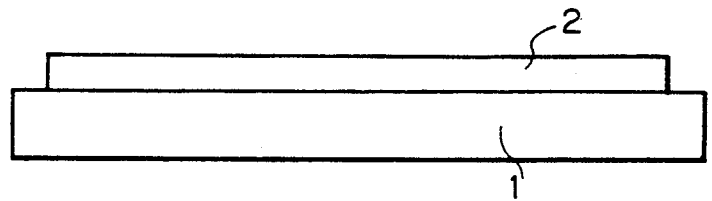
FIGS. 1(a)-1(g) illustrate manufacturing steps in accordance with a first preferred embodiment of the invention.

First, a solid layer is formed all over an aluminum flat board 1 to the extent of a pattern area as shown in FIG. 1(a) using polyimide 2 having a low coefficient of thermal expansion.

Figure 1B:
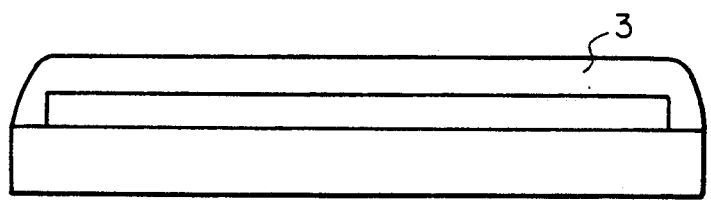

Then, another layer of polyimide 3 having a low coefficient of thermal expansion is formed over an area larger than the solid layer formed in the step of FIG. 1(a), as shown in FIG. 1(b).

Figure 1C:
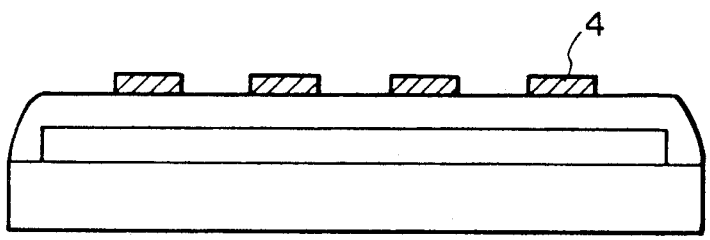

Subsequently, grounding and connecting wiring layers 4 are formed as shown in FIG. 1(c) by patterning by photolithography using a photoresist and by electrolytic gold plating.

Figure 1D:
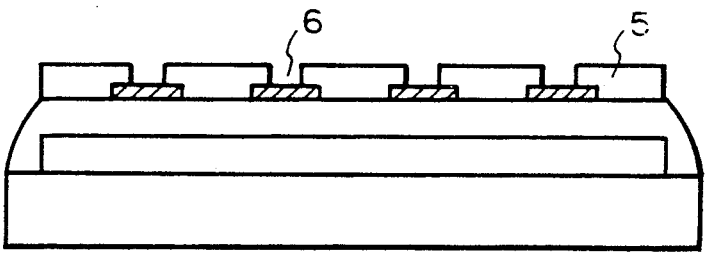

Then, photosensitive polyimide varnish 5 is applied to the aluminum flat board 1 on which the grounding and connecting layer 4 is formed, and then, exposure and development are performed to form viaholes 6 at predetermined positions in the polyimide varnish 5 as shown in FIG. 1(d), thereafter curing is performed.

Figure 1E:
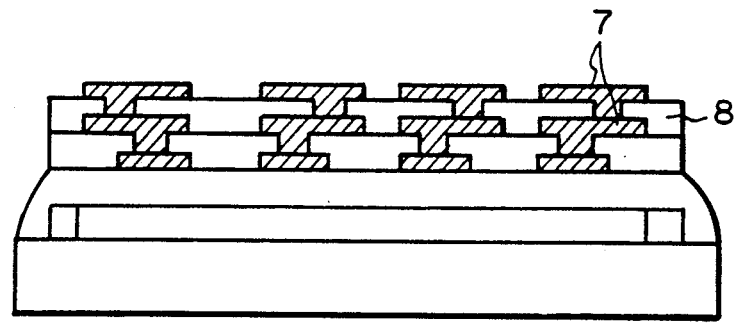

Then, a set of signal wiring layers 7 are formed using photosensitive polyimide 8 for the interlayer insulation as shown in FIG. 1(e). Signal wiring layers 7 are formed by the method in which grounding and connecting layers 4 are formed in the step of FIG. 1(c), and then a signal interlayer insulation layer is formed by the method by which the insulation layer is formed in the step of FIG. 1(d).

Figure 1F:
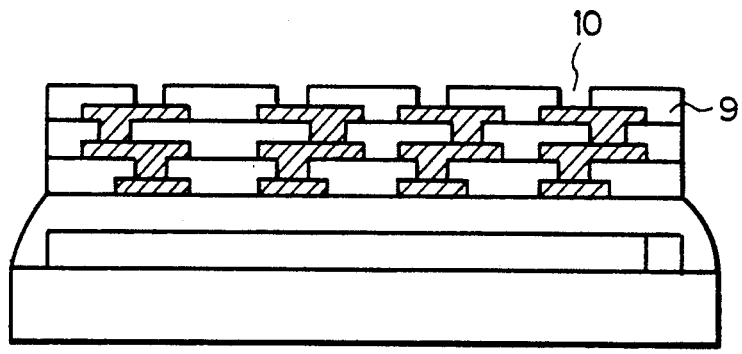

Subsequently, polyimide varnish 9 is applied to the signal wiring layers 7, and exposure and development are performed to form viaholes 10 at predetermined positions in the layer of polyimide varnish 9 as shown in FIG. 1(f), thereafter curing is performed.

Figure 1G:
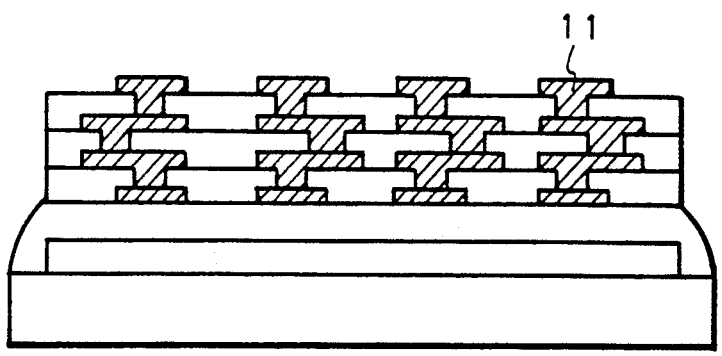

Then, connecting bumps 11 are formed, as shown in FIG. 1(g), in the uppermost layer of the multilayer wiring substrate, in which a required number of layers are formed, at positions at which electric connection is established to another multilayer wiring layer to be formed in the steps shown in FIGS. 2(a)-(f). Bumps 11 are formed by patterning by photolithography using a photoresist and by electrolytic gold plating. The thickness of the plated layer of gold is 10 μm.

Subsequently, a set of signal wiring layers and a set of grounding and connecting layers which hold the signal wiring layers therebetween are formed on a ceramic substrate in the following steps separately from the polyimide wiring layer structure manufactured as described above.

Figure 2A:
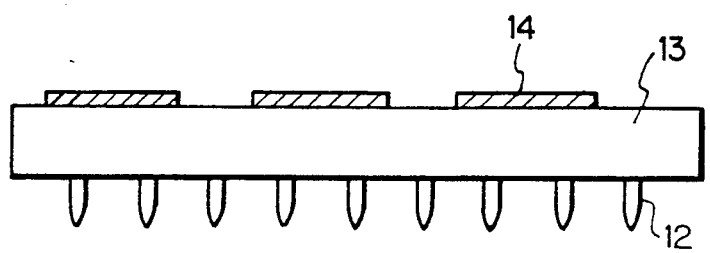
FIGS. 2(a)-(f) illustrate manufacturing steps in accordance with a first preferred embodiment of the invention.

First, a grounding and connecting wiring layer 14 is formed on ceramic board 13, which has signal input/output pins and power source pins 12 provided on the rear face thereof, as shown in FIG. 2(a) by patterning by photolithography using a photoresist and by electrolytic gold plating.

Figure 2B:
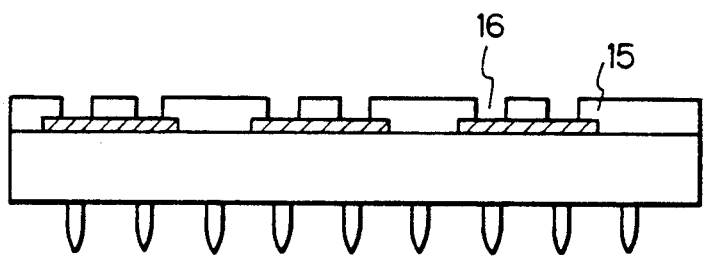

Then, photosensitive polyimide varnish 15 is applied to the ceramic board 13, on which the grounding and connecting layer 14 is formed, and exposure and development are performed to form viaholes 16 at predetermined positions in the polyimide varnish 15 as shown in FIG. 2(b), thereafter curing is performed.

Figure 2C:
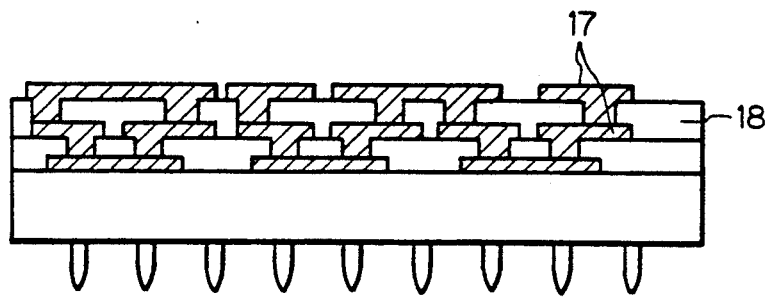

Subsequently, a set of signal wiring layers 17 are formed using photosensitive polyimide 18 for the interlayer insulation as shown in FIG. 2(c). The signal wiring layers 17 are formed by the method in which grounding and connecting layer 14 is formed in the step of FIG. 2(a), and then a signal interlayer insulation layer is formed by the method in which the insulation layer is formed in the step of FIG. 2(b).

Figure 2D:
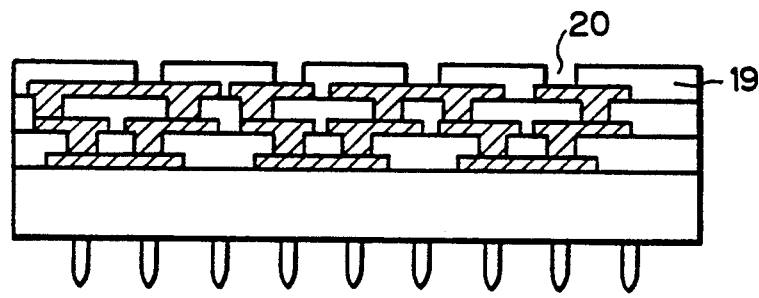

Then, photosensitive polyimide varnish 19 is applied to signal wiring layers 17, and exposure and development are performed to form viaholes 20 at predetermined positions in the layer of polyimide varnish 19 as shown in FIG. 2(d), thereafter curing is performed.

Figure 2E:
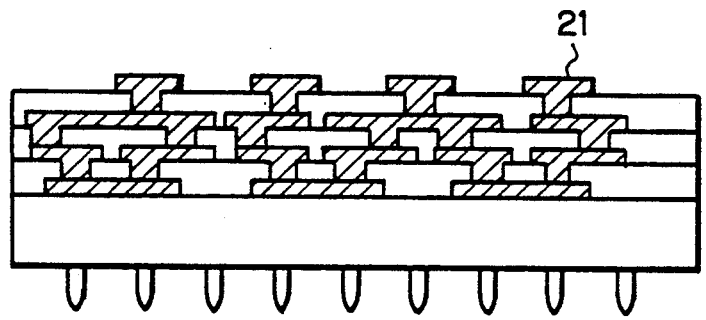

Then, connecting bumps 21 are formed on polyimide layer 19 as shown in FIG. 2(e) by the method used in the step of FIG. 1(g).

Figure 2F:
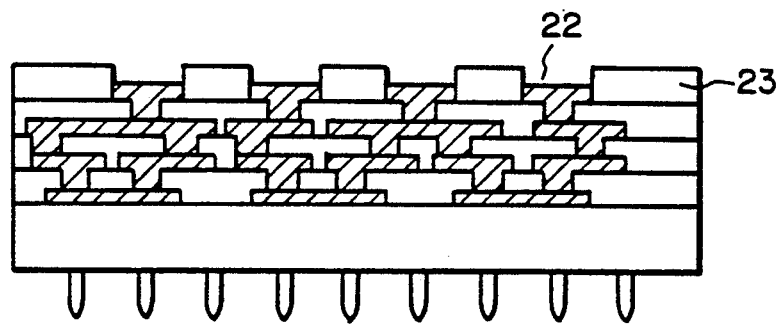

Then, polyimide layer 23 in which viaholes 22 are formed are formed on connecting bumps 21 as shown in FIG. 2(f) in a similar manner to the step of FIG. 4(d).

Figure 3:
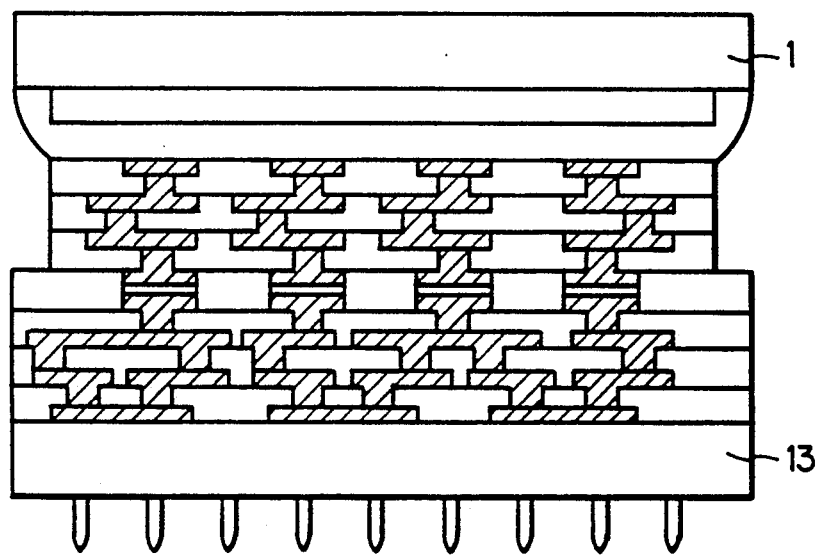
FIGS. 3-10 illustrate manufacturing steps in accordance with a first preferred embodiment of the invention.

Subsequently, the polyimide layer, which has connecting metal bumps 11 thereon, of the polyimide multilayer wiring layers on aluminum flat board 1 formed in the steps of FIGS. 1(a) to (g) and the polyimide layer, which has metal bumps 21 thereon, of the polyimide multilayer wiring layers on ceramic board 13 formed in the steps of FIGS. 2(a)-(f) are aligned and stacked on each other as shown in FIG. 3, and then they are pressurized and heated to a temperature higher than the glass transition point of the polyimide resin to adhere and secure the polyimide layers to each other. The metal bumps 11 and 21 are joined to each other so that the two layered structures are electrically connected to each other. The pressurizing and heating methods are as follows. A vacuum press apparatus of the autoclave type is used for the pressurization and heating, and nitrogen gas is used as the pressurizing gas. The pressurization is performed at 3 kg/cm² at the substrate temperature up to 250° C. and at 14 kg/cm² at the substrate temperature in the range of 250° C. to 350° C. In this instance, the board is placed on a platen and is sealed using a polyimide film, and then the inside of the polyimide film is kept under vacuum.

Figure 4:
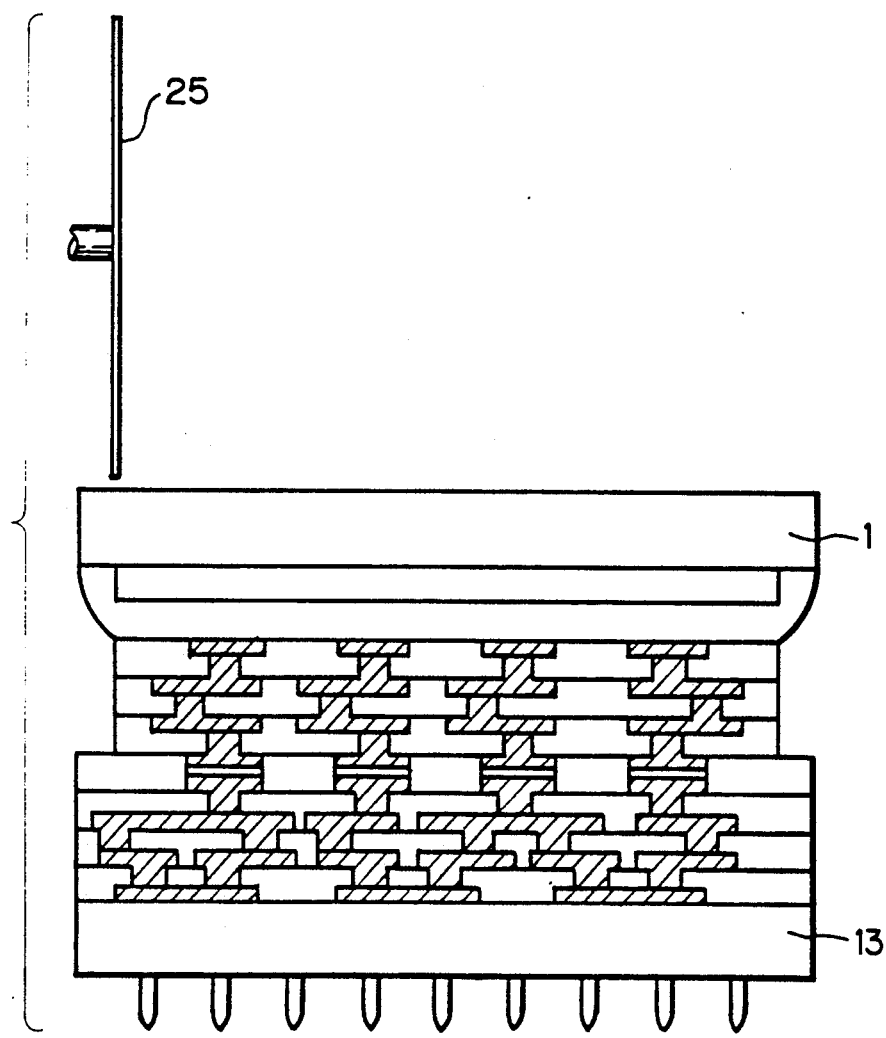
Figure 5:
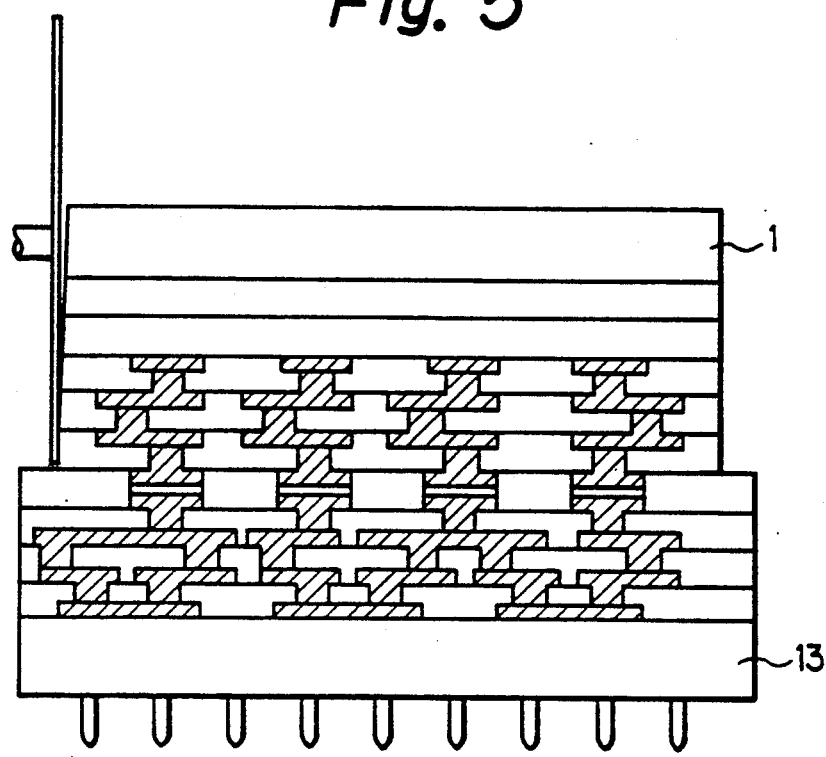

Subsequently, aluminum flat board 1 of the substrate adhered as described above is cut to the size of the pattern area using dicing saw 25 as shown in FIGS. 4 and 5.

Figure 6:
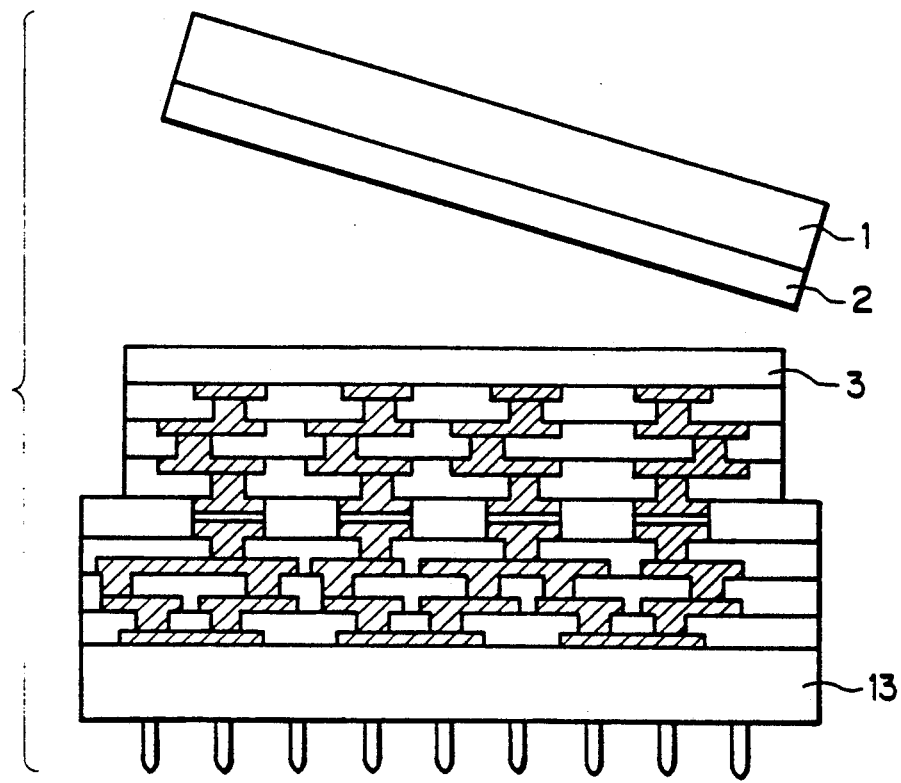

Then, aluminum flat board 1 is separated as shown in FIG. 6 making use of the fact that polyimide layer 2 of low coefficient of thermal expansion on aluminum flat board 1 is not in close contact with polyimide layer 3 on the polyimide layer 2.

Figure 7:
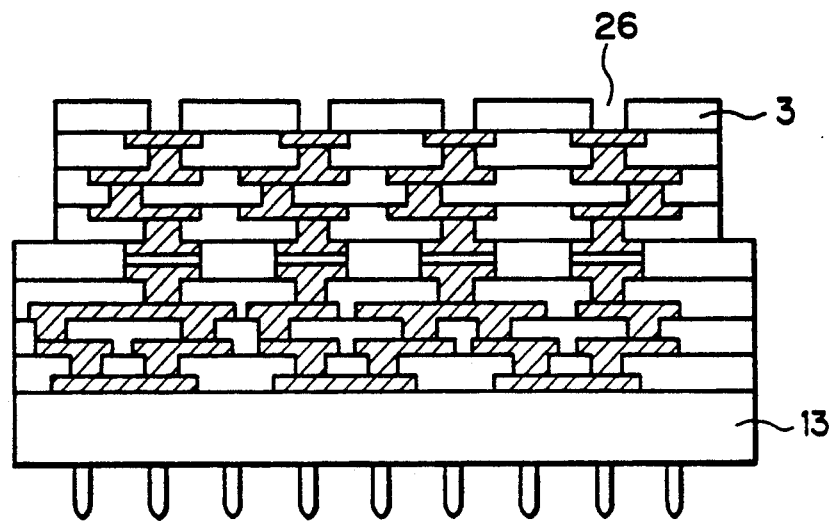
Figure 8:
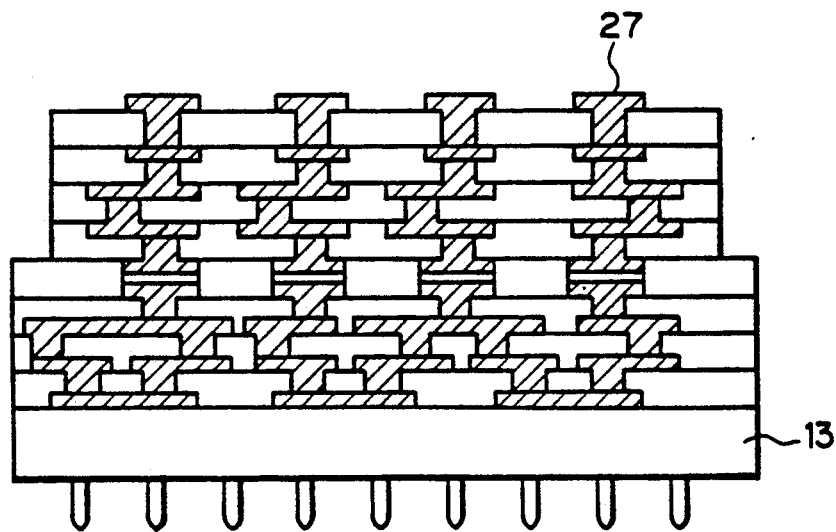
Figure 9:
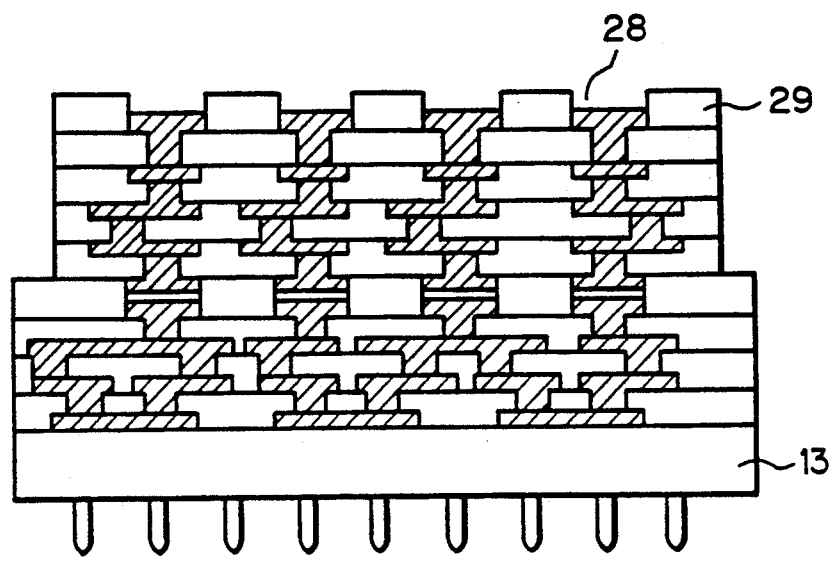

Then, a dry etching process is performed on low thermal expansion polyimide 3 having been exposed in the step of FIG. 8 to form viaholes 26 at predetermined positions in the layer of polyimide 3 as shown in FIG. 7.

Then, metal bumps 27 are formed on the polyimide layer formed in the step of FIG. 7, as shown in FIG. 8. The forming method is the same as in the step of FIG. 2(e).

Then, as shown in FIG. 11, a polyimide layer 29 in which viaholes 28 are formed is formed in a similar manner as in the step of FIG. 2(d) on metal bumps 27 formed in the step of FIG. 8.

Figure 10:
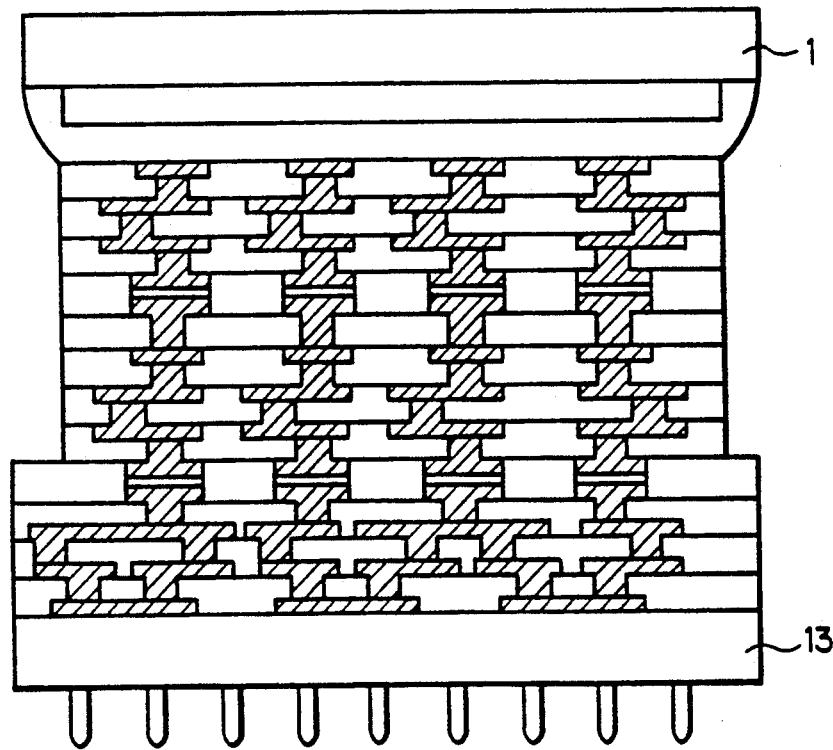

Another polyimide wiring layers formed in the steps of FIGS. 1(a) to 1(g) is superposed on the polyimide wiring layer structure formed in the steps as described above by the method of FIGS. 3 to 6, and the steps as described above are repeated until a designed number of wiring layers are formed. FIG. 10 shows a polyimide multilayer wiring substrate finally obtained.

FIGS. 11 to 18 show a second embodiment of a method for manufacturing a polyimide multilayer wiring substrate of the present invention in the order of steps. In a polyimide multilayer wiring substrate according to the present embodiment, the thickness of a wiring interlayer insulation layer is 20 μm; the width of a signal wiring is 25 μm; and the thickness of a signal wiring film is 10 μm, and a photosensitive polyimide material having no glass transition point and having a low coefficient of thermal expansion is employed as the polyimide resin while another polyimide resin having a glass transition point is used for adhesion layers and copper is employed as wiring metal.

First, a set of signal wiring layers and a grounding and connecting layer are formed on a flat board of sapphire (hereinafter referred to simply as sapphire flat board) by the following method.

Figure 11A:
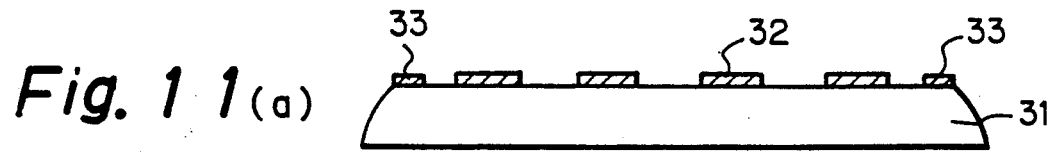
FIGS. 11(a)-(e) illustrate manufacturing steps in accordance with a second preferred embodiment.

First, a grounding and connecting wiring layer 32 is formed on a sapphire flat board 31 as shown in FIG. 11(a) by patterning by photolithography using a photoresist and by electrolytic copper plating. Further, vapor deposition film 33 of metal is formed along an outer periphery of the substrate.

Figure 11B:
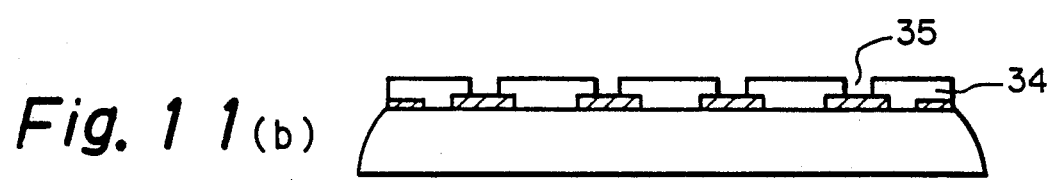

Then, photosensitive polyimide varnish 34 is applied to sapphire flat board 31 on which grounding and connecting layer 32 and vapor deposition film 33 are formed, and then, exposure and development are performed to form viaholes 6 at predetermined positions in the insulation layer of polyimide varnish 34 as shown in FIG. 11(b), thereafter curing is performed.

Figure 11C:
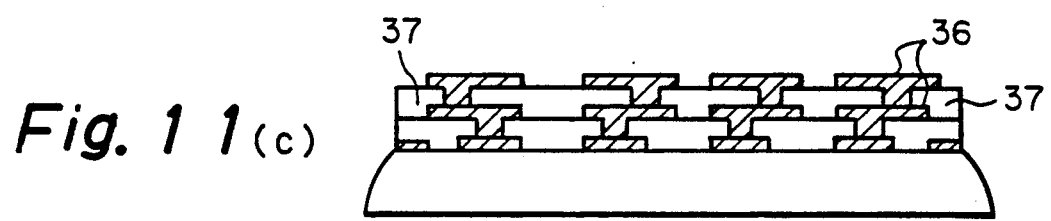

Then, a set of signal wiring layers 36 are formed using photosensitive polyimide 37 for the interlayer insulation as shown in FIG. 11(c). A signal wiring layer 36 is formed by the method in which grounding and connecting layer 32 is formed in the step of FIG. 11(a), and then a signal interlayer insulation layer is formed by the method in which the insulation layer is formed in the step of FIG. 11(b).

Figure 11D:
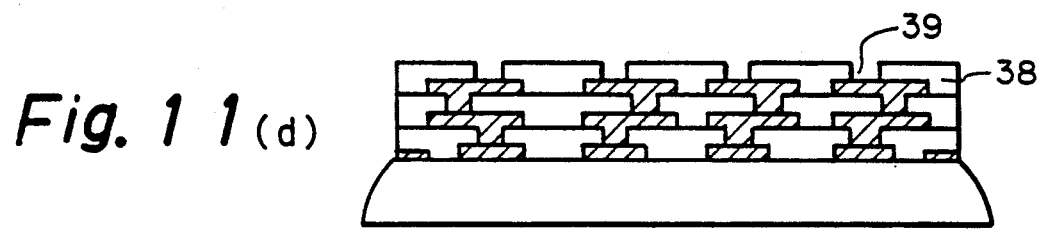

Subsequently, polyimide varnish 38 is applied to signal wiring layers 36, and exposure and development are performed to form viaholes 39 at predetermined positions in the layer of polyimide varnish 38 as shown in FIG. 11(d), thereafter curing is performed.

Figure 11E:
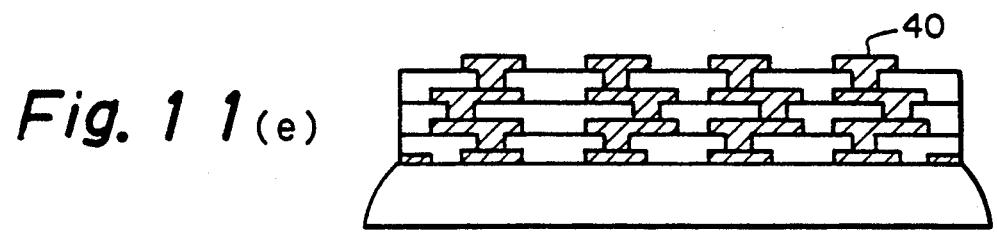
Figure 12:
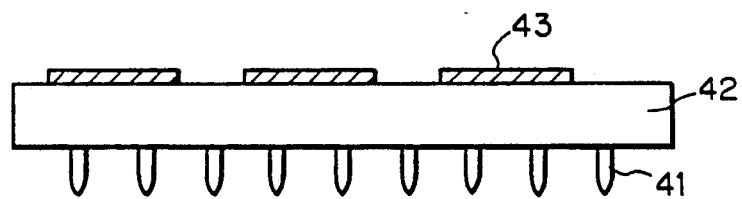
FIGS. 12(a)-(f) illustrate manufacturing steps in accordance with a second preferred embodiment.
Figure 12:
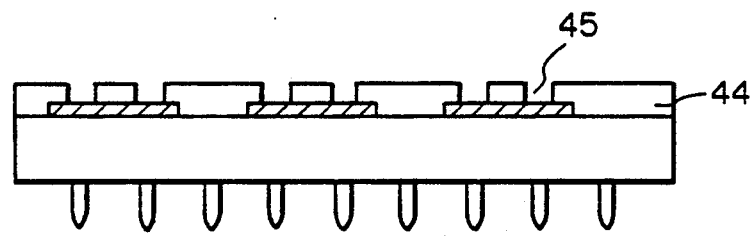
Figure 12:
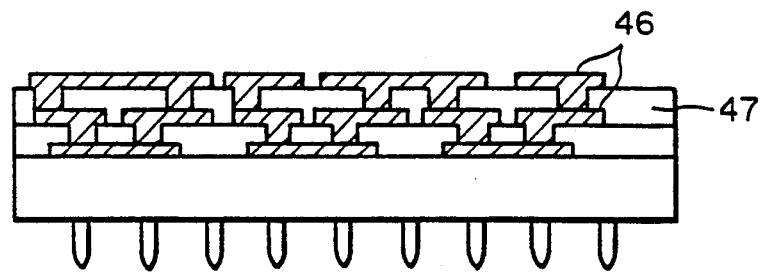

Then, connecting bumps 40 are formed, as shown in FIG. 11(e), in the uppermost layer of the multilayer wiring layers, in which a required number of layers are formed in the step of FIG. 11(d), at positions at which electric connection is established to a multilayer wiring layers to be formed in the steps shown in FIGS. 12(a)–(f). Bumps 40 are formed by patterning by photography using a photoresist and by electrolytic gold plating. The thickness of the plated layer of gold is 10 μm.

Subsequently, a set of signal wiring layers and a set of grounding and connecting layers which hold the signal wiring layers therebetween are formed on another ceramic board separately from the polyimide wiring layer structure manufactured as described above.

First, a grounding and connecting wiring layer 43 is formed on a ceramic board 42, which has signal input-/output pins and power source pins 41 provided on the rear face thereof, as shown in FIG. 12(a) by patterning by photolithography using a photoresist and by electrolytic copper plating.

Then, photosensitive polyimide varnish 44 is applied to the ceramic substrate 42, on which grounding and connecting layer 43 is formed, and exposure and development are performed to form viaholes 45 at predetermined positions in the insulation layer of polyimide varnish 44 as shown in FIG. 12(b), thereafter curing is performed.

Subsequently, a set of signal wiring layers 46 are formed using photosensitive polyimide 47 for the interlayer insulation as shown in FIG. 12(c). Signal wiring layers 46 are formed by the method in which grounding and connecting layer 43 is formed in the step of FIG. 12(a), and then a signal interlayer insulation layer is formed by the method in which the insulation layer is formed in the step of FIG. 12(b).

Then, photosensitive polyimide varnish 48 is applied to the signal wiring layers 46, and exposure and development are performed to form viaholes 49 at predetermined positions in the layer of polyimide varnish 47 as shown in FIG. 12(d), thereafter curing is performed.

Then, connecting metal bumps 50 are formed on polyimide layer 48 as shown in FIG. 12(e) by the method used in the step of FIG. 11(e).

Then, a polyimide layer 52 in which viaholes 51 are formed is formed on connecting bumps 50 as shown in FIG. 12(f) in a similar manner as in the step of FIG. 12(d).

Subsequently, the polyimide layer, which has connecting metal bumps 40 thereon, of the polyimide multilayer wiring layers on sapphire flat board 31 formed in the steps of FIG. 11(a)–(c) and the polyimide layer, which has metal bumps 50 thereon, of the polyimide multilayer wiring layers on ceramic board 42 formed in the steps of FIGS. 12(a)–(f) are aligned and then stacked on one another as shown in FIG. 13, and then they are pressurized and heated to a temperature higher than the glass transition point of the polyimide resin to adhere and secure the polyimide films of the polyimide multilayer wiring layers to each other. Thereupon, metal bumps 40 and 50 formed on the polyimide layers are joined to each other so that the two layered structures are electrically connected to each other. The pressurizing and heating methods are as follows. A vacuum press apparatus of the autoclave type is used for the pressurization and heating, and nitrogen gas is used as the pressurizing gas. The pressurization is performed at 3 kg/cm² at the substrate temperature up to 250° C. and at 14 kg/cm² in the substrate temperature range of 250° C. to 350° C. In this instance, the substrate is placed on a platen and is sealed using a polyimide film, and then the inside of the polyimide film is kept under vacuum.

Figure 14:
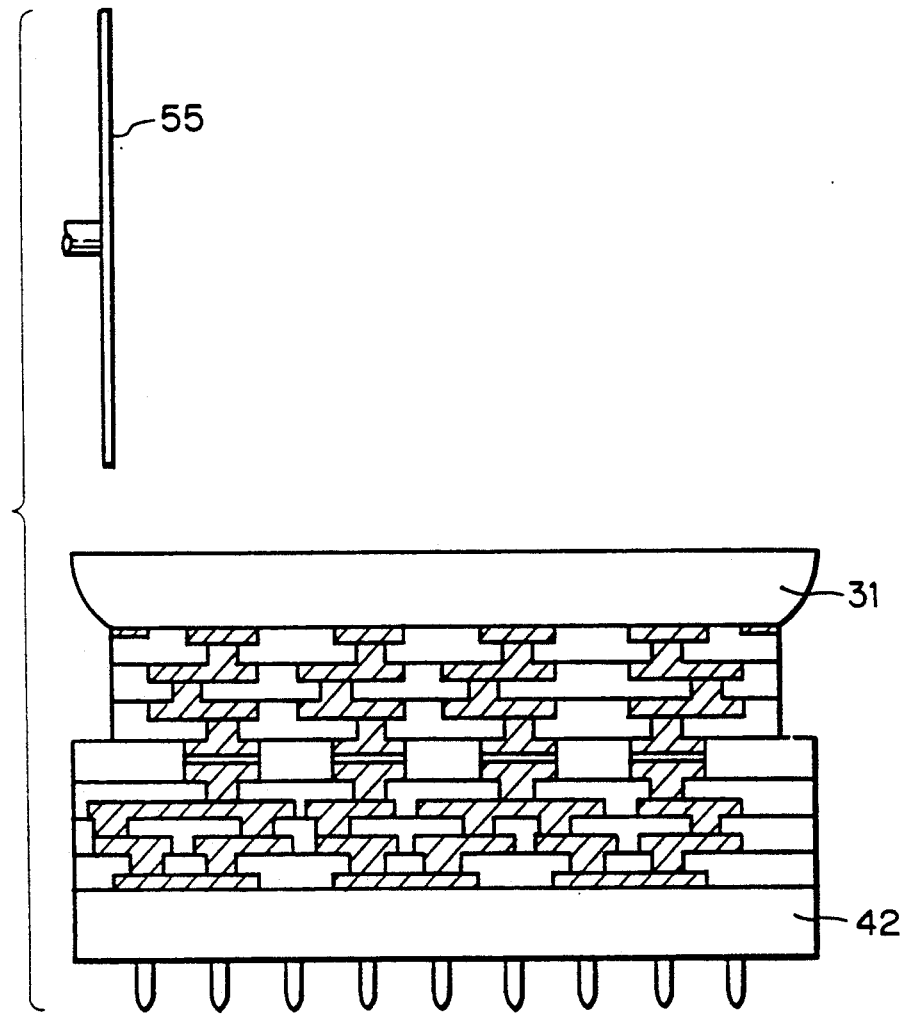
Figure 15:
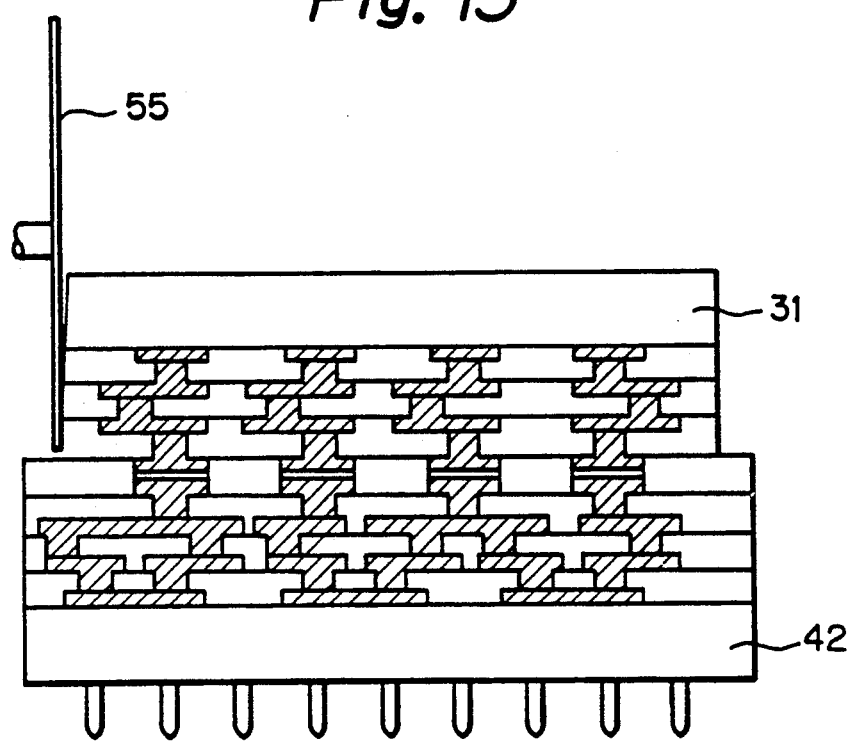
Figure 18:
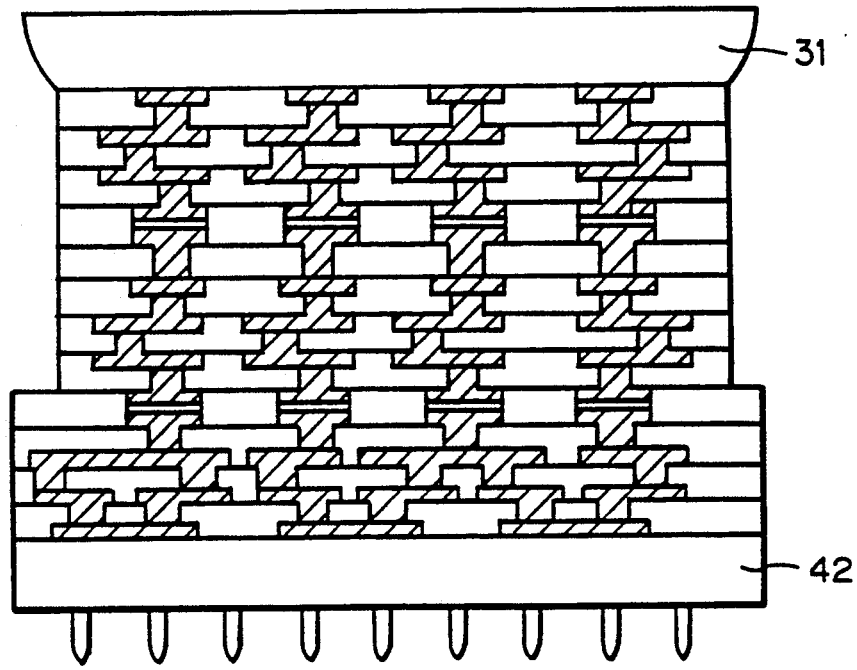

Subsequently, the sapphire flat plate 31 of the substrate adhered as described above is cut into a size of the pattern area so as to remove metal vapor deposition film 33 using dicing saw 55 as shown in FIGS. 14 and 18.

Figure 16:
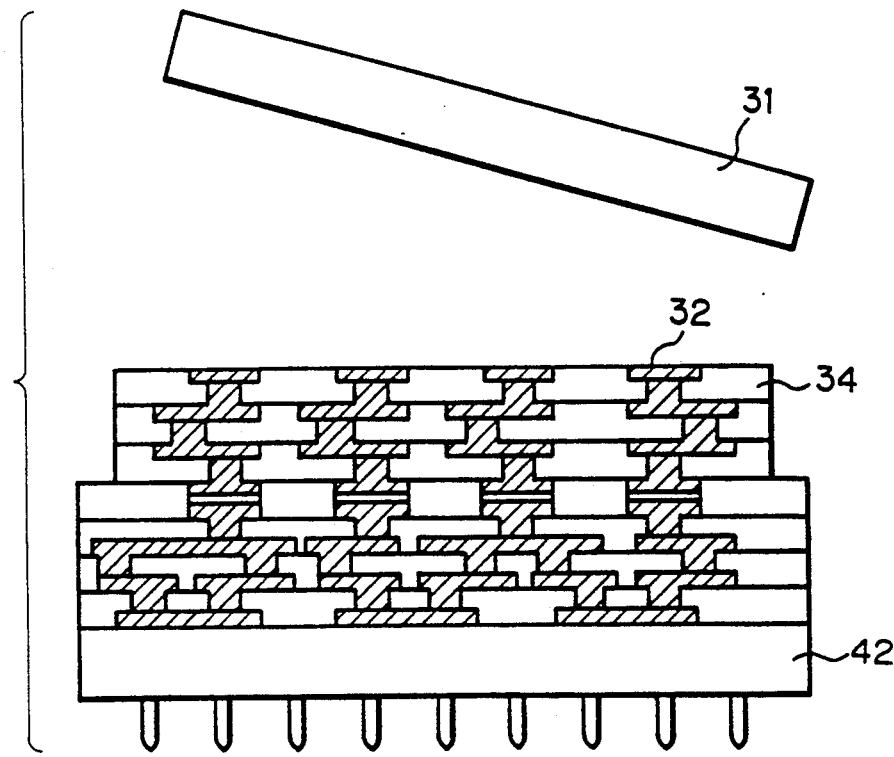

Then, sapphire flat board 31 is separated as shown in FIG. 16 making use of the fact that it is not in close contact with layer 34 of polyimide having a low coefficient of thermal expansion and with metal wiring layer 32.

Figure 17:
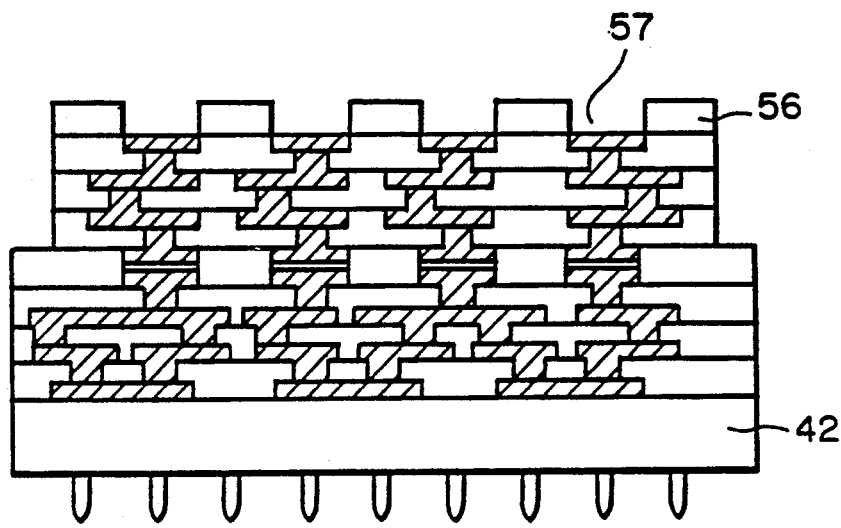

Then, photosensitive polyimide varnish 56 is applied to grounding and connecting wiring layer 32 having been exposed in the step of FIG. 16, and exposure and development are performed to form viaholes 57 at predetermined positions in the layer of polyimide varnish 56 as shown in FIG. 17, thereafter curing is performed.

Another polyimide wiring layers formed in the steps of FIG. 11(a)–(e) is superposed on the polyimide wiring layer structure formed in the steps as described above by the method of FIGS. 13-17.

The steps described above are repeated until a designed number of wiring layers are formed. FIG. 18 shows a polyimide multilayer wiring substrate finally obtained.

FIGS. 19(a)-(g) show a third embodiment of a method for manufacturing a polyimide multilayer wiring substrate of the present invention in the order of steps. In a polyimide multilayer wiring substrate according to the present embodiment, the thickness of a wiring interlayer insulation layer is 20 μm; the width of a signal wiring is 25 μm; and the thickness of a signal wiring film is 10 μm, and a photosensitive polyimide material having a glass transition point is employed as the polyimide resin and gold is employed as the wiring metal.

First, a set of signal wiring layers and a grounding and connecting layer are formed on a flat board of silicon (hereinafter referred to simply as silicon flat board) by the following method.

Figure 19:
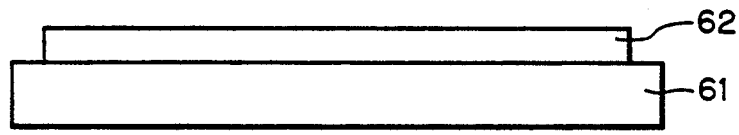
FIGS. 19(a)-19(g) illustrate manufacturing steps in accordance with a third preferred embodiment of the invention.
Figure 19:
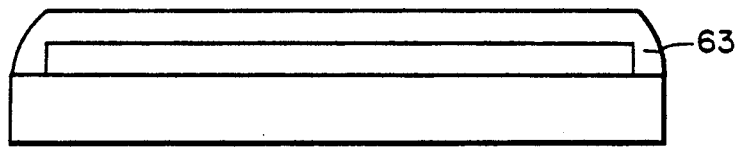
Figure 19:
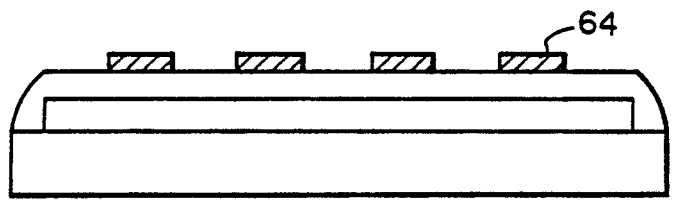
Figure 19:
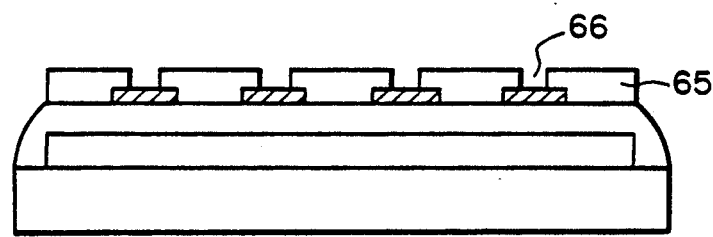

Solid layer 62 is formed on silicon flat board 61 to the extent of a pattern area with the thickness of 1 to 2 μm by electroless nickel plating as shown in FIG. 19(a).

Then, polyimide layer 63 having a larger area than electroless nickel plated solid layer 62 is formed as shown in FIG. 19(b).

Then, a grounding and connecting wiring layer 64 is formed on the silicon flat board 61 as shown in FIG. 19(c) by patterning by photolithography using a photoresist and by electrolytic gold plating.

Then, photosensitive polyimide varnish 65 is applied to the silicon flat plate 61 on which the grounding and connecting layer 64 is formed, and then, exposure and development are performed to form viaholes 66 at predetermined positions in the insulation layer of polyimide varnish 65 as shown in FIG. 19(d), thereafter curing is performed.

Figure 19E:
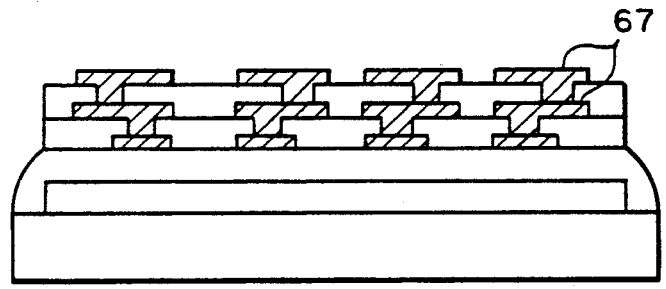

Then, a set of signal wiring layers 67 are formed using photosensitive polyimide 68 for the interlayer insulation as shown in FIG. 19(e). In the formation, signal wiring layers 67 are formed by the method in which grounding and connecting layer 64 is formed, and a signal interlayer insulation layer is formed by the method in which the insulation layer is formed in the step of FIG. 19(d).

Figure 19F:
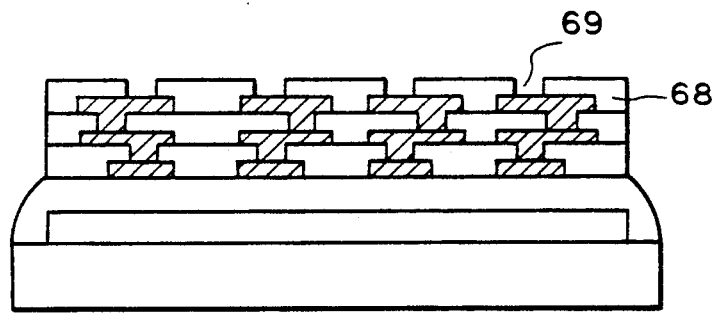

Subsequently, polyimide varnish 68 is applied to signal wiring layers 67, and exposure and development are performed to form viaholes 69 at predetermined positions in the layer of polyimide varnish 68 as shown in FIG. 19(f), thereafter curing is performed.

Then, connecting bumps 70 are formed, as shown in FIG. 19(f), in the uppermost layer of the multilayer wiring layers, in which a required number of layers are formed in the step of FIG. 19(f), at positions at which electric connection is established to a multilayer wiring layer to be formed in the steps shown in FIGS. 20(a)-(f). Bumps 70 are formed by patterning by photography using a photoresist and by electrolytic gold plating. The thickness of the plated layer of gold is 10 μm.

Subsequently, a set of signal wiring layers and a set of grounding and connecting layers which hold the signal wiring layers therebetween are formed on a ceramic board separately from the polyimide wiring layer structure manufactured as described above.

Figure 20A:
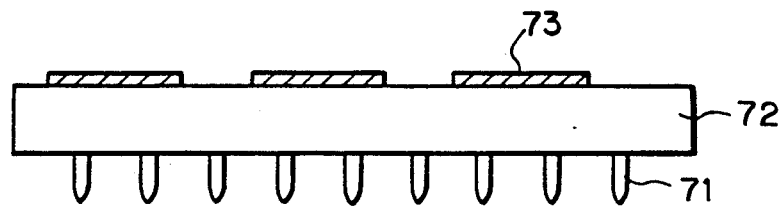
FIGS. 20(a)-(f) illustrate manufacturing steps in accordance with a third preferred embodiment of the invention.

First, grounding and connecting wiring layer 73 is formed on a ceramic board 72, which has signal input/output pins and power source pins 71 provided on the rear face thereof, as shown in FIG. 20(a) by patterning by photolithography using a photoresist and by electrolytic gold plating.

Figure 20B:
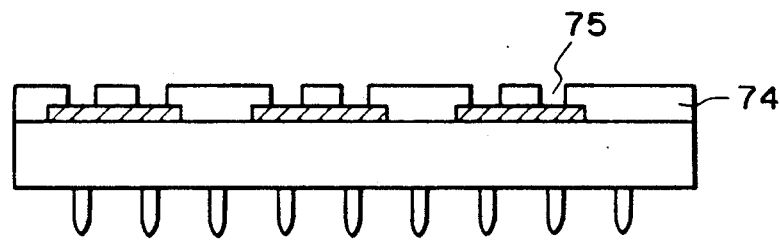

Then, photosensitive polyimide varnish 74 is applied to the ceramic board 72, on which grounding and connecting layer 73 is formed, and exposure and development are performed to form viaholes 75 at predetermined positions in the insulation layer of polyimide varnish 74 as shown in FIG. 20(b), thereafter curing is performed.

Figure 20C:
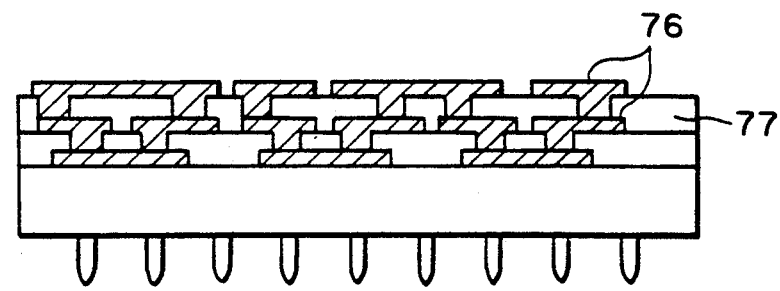

Subsequently, a set of signal wiring layers 76 are formed using photosensitive polyimide 77 for the interlayer insulation as shown in FIG. 20(c). Signal wiring layer 76 is formed by the method in which ground and connecting layer 73 is formed in the step of FIG. 20(a), and then a signal interlayer insulation layer is formed by the method in which the insulation layer is formed in the step of FIG. 20(b).

Figure 20D:
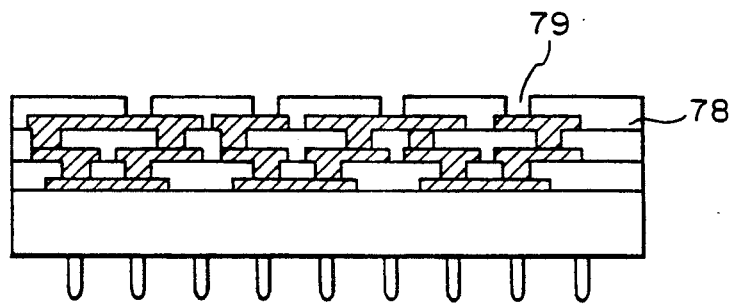

Then, photosensitive polyimide varnish 78 is applied to signal wiring layers 76, and exposure and development are performed to form viaholes 79 at predetermined positions in the layer of polyimide varnish 78 as shown in FIG. 20(d), thereafter curing is performed.

Figure 19G:
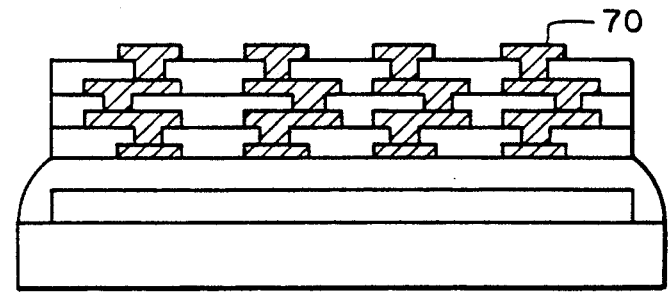
Figure 20E:
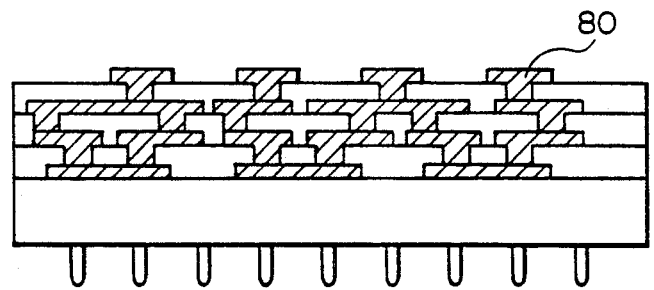

Then, connecting bumps 80 are formed on polyimide layer 78 as shown in FIG. 20(e) by the method used in the step of FIG. 19(g).

Figure 20F:
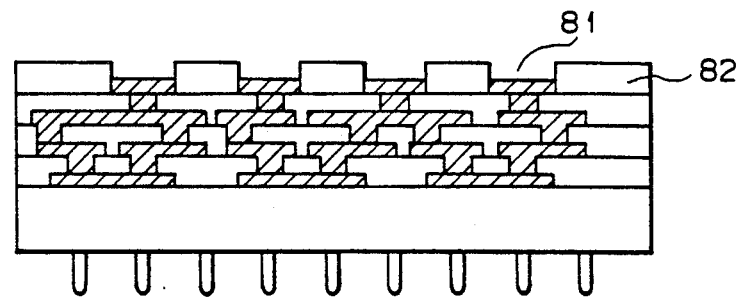

Then, polyimide layer 82 in which viaholes 81 are formed are formed on connecting bumps 80 as shown in FIG. 20(f) in a similar manner as in the step of FIG. 20(d).

Figure 21:
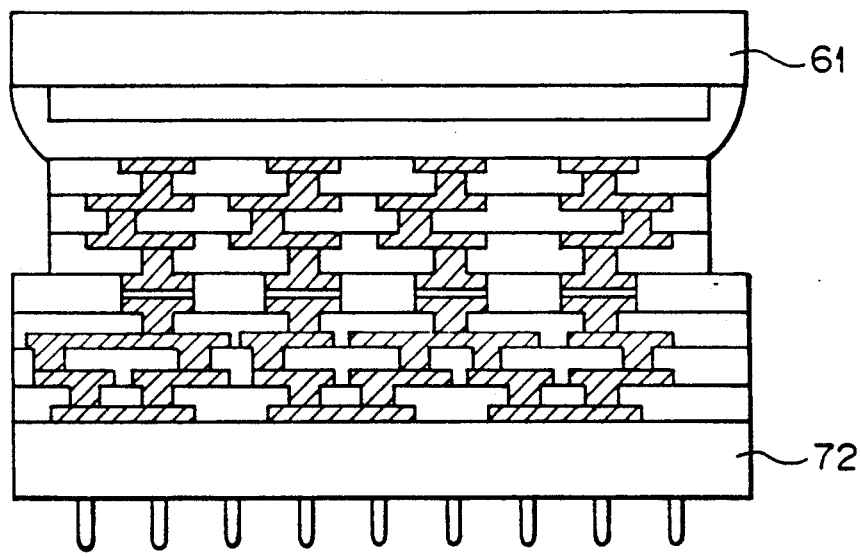
FIGS. 21-28 illustrate manufacturing steps in accordance with a third preferred embodiment of the invention.

Subsequently, the polyimide layer, which has connecting metal bumps 70 thereon, of the polyimide multilayer wiring layer on the silicon flat board formed in the steps of FIGS. 19(a)-(g) and the polyimide layer, which has metal bumps 80 thereon, of the polyimide multilayer wiring layer on ceramic board 72 formed in the steps of FIGS. 20(c)-(f) are aligned and then superposed on one another as shown in FIG. 21, and then they are pressurized and heated to a temperature higher than the glass transition point of the polyimide resin to adhere and secure the polyimide layers of the polyimide multilayer wiring layers to each other. Thereupon, metal bumps 70 and 80 formed on the polyimide layers are joined to each other so that the two layered structures are electrically connected to each other. The pressurizing and heating methods are as follows. A vacuum press apparatus of the autoclave type is used for the pressurization and heating, and nitrogen gas is used as the pressurizing gas. The pressurization is performed at 3 kg/cm² at the substrate temperature up to 250° C. and at 14 kg/cm² in the substrate temperature range of 250° C. to 350° C. In this instance, the substrate is placed on a platen and is sealed using a polyimide film, and then the inside of the polyimide film is put under vacuum.

Figure 22:
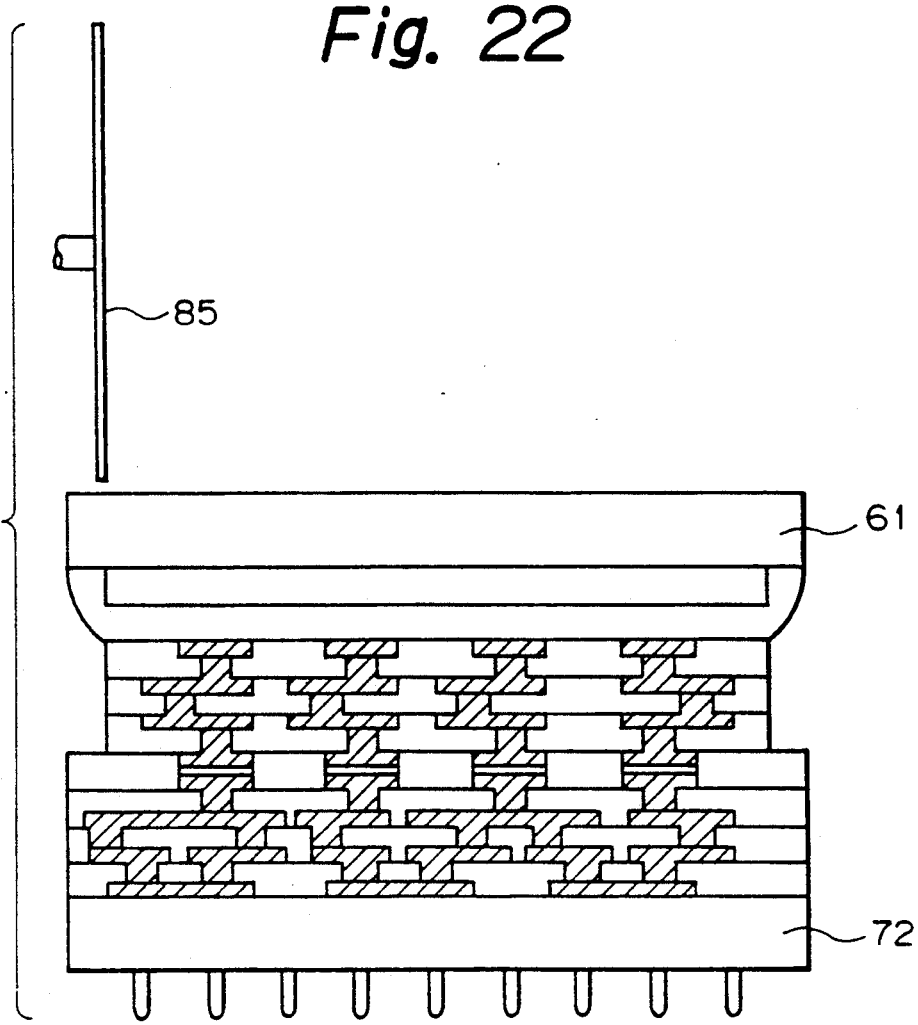
Figure 23:
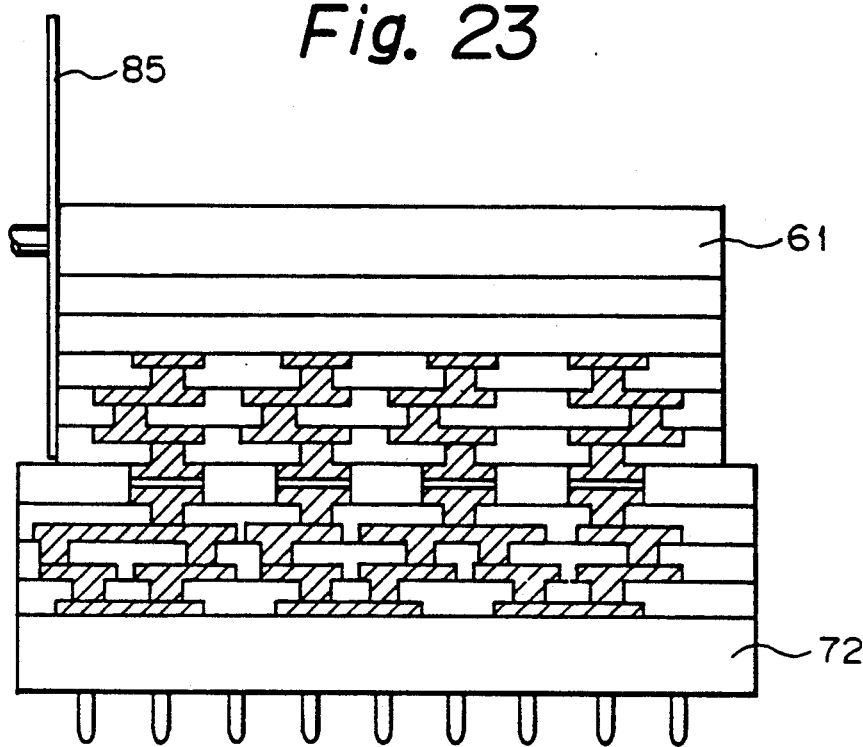

Subsequently, silicon flat board 61 of the substrate adhered as described above is cut into the size of the pattern area using dicing saw 55 as shown in FIGS. 22 and 23.

Figure 24:
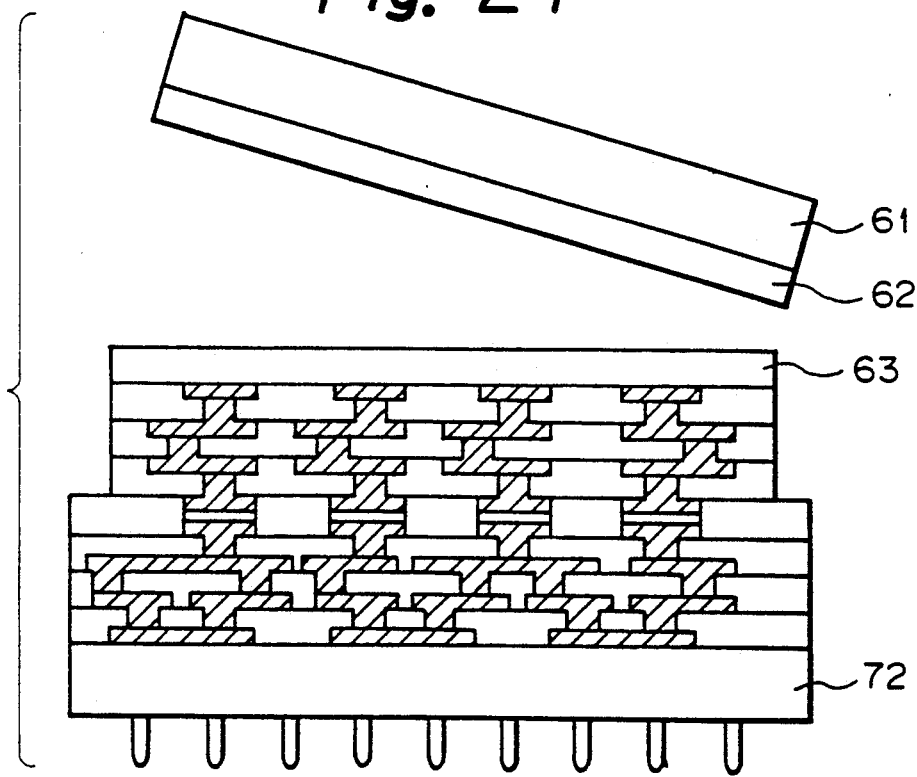

Then silicon flat plate 61 is separated as shown in FIG. 24 making use of the fact that electroless nickel plated layer 62 thereon is not in close contact with polyimide layer 63 on electroless nickel plate layer 62.

Figure 25:
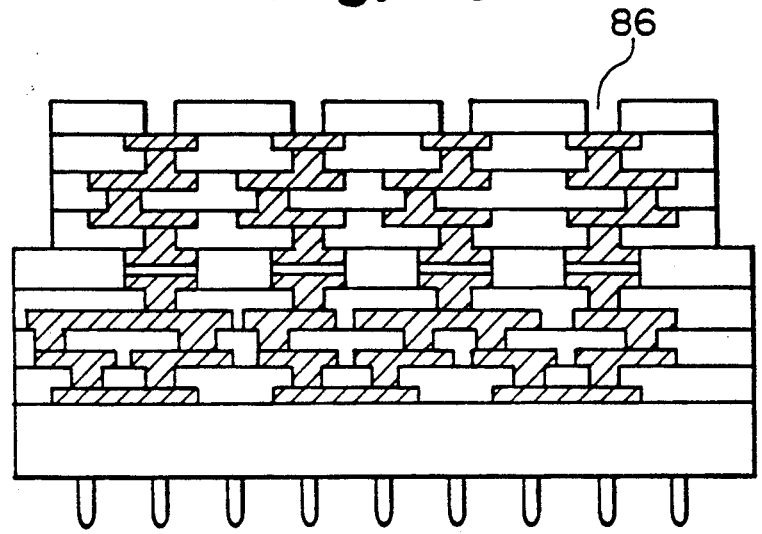

Then, a dry etching process is performed for polyimide layer 63 having been exposed in the step of FIG. 24 to form viaholes 86 at predetermined positions in polyimide layer 63 as shown in FIG. 25.

Figure 31:
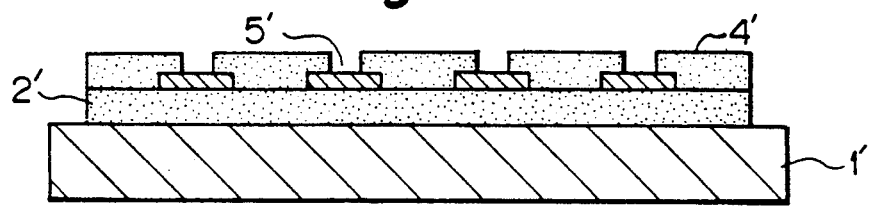

Then, metal bumps 87 are formed on polyimide layer 63, as shown in FIG. 31. The forming method is the same as in the step of FIG. 19(g).

Figure 26:
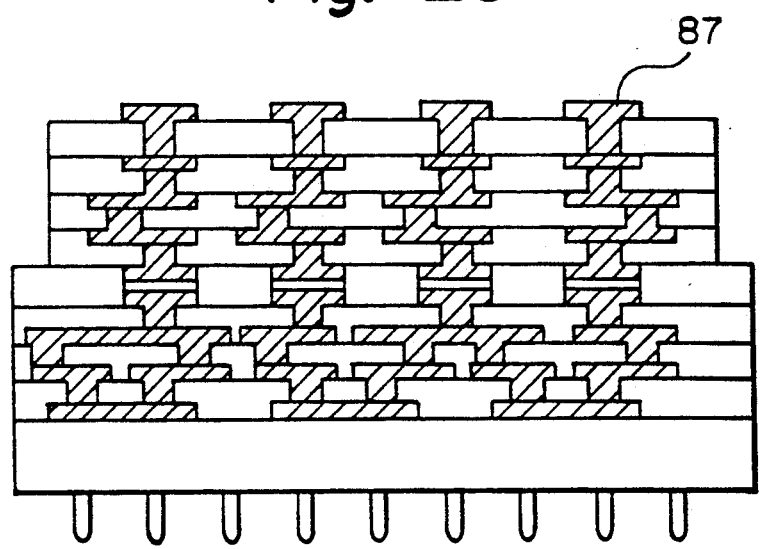
Figure 27:
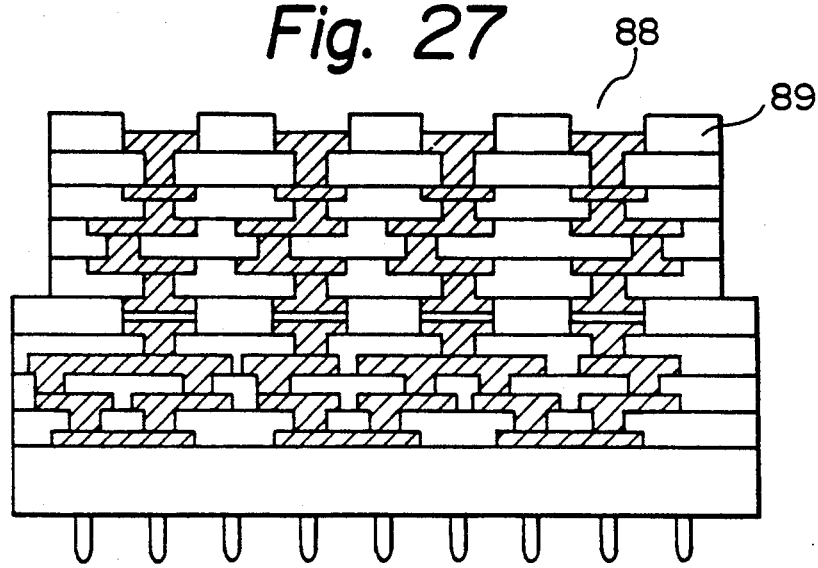

Then, as shown in FIG. 27, polyimide layer 89 in which viaholes 88 are formed is formed on metal bumps 87 formed in the step of FIG. 26.

Another polyimide wiring layer formed in the steps of FIGS. 19(a)–(g) is superposed on the polyimide wiring layer structure formed in the steps of FIGS. 19(a)–(g), by the methods of FIGS. 21-24.

Figure 28:
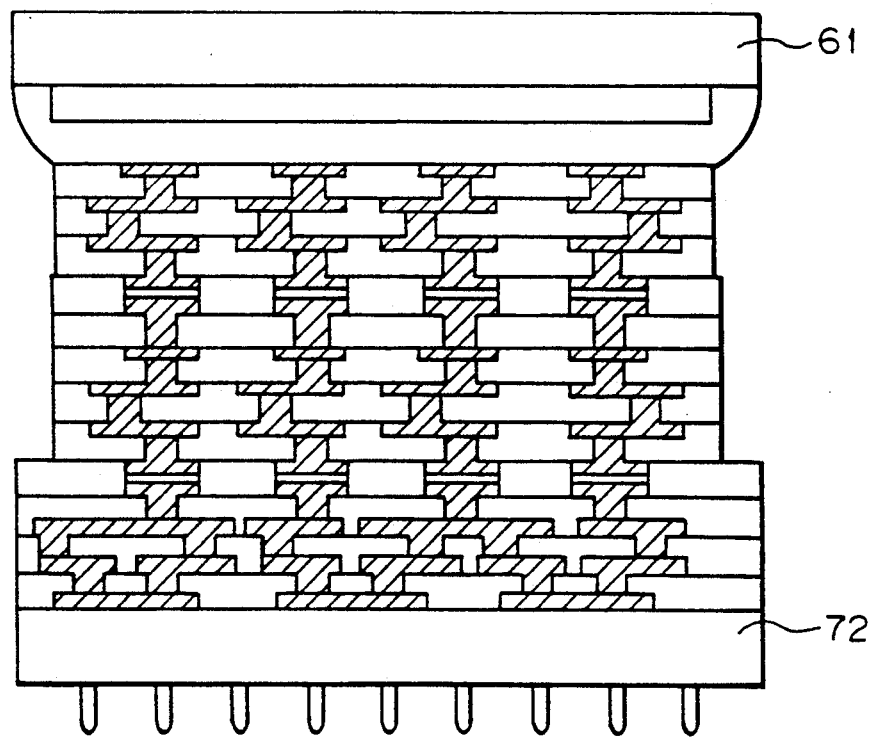
Figure 29:
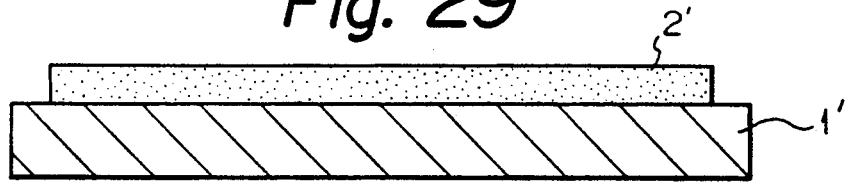
FIGS. 29-46 illustrate manufacturing steps in accordance with a fourth preferred embodiment of the invention.

The steps described above are repeated until a designed number of wiring layers are formed. FIG. 28 shows a polyimide multilayer wiring substrate finally obtained.

While the three embodiments are described above, any of low resistance metals such as copper can be employed in addition to the metals described above as the metal wiring material.

It is to be noted that melt-curable maleimide resin films and fusible fluoroplastic films such as, for example, a PFA (copolymer of fluoroethylene and perfluoroalkyl perfluorovinyl ether) film may be selectively employed as the material of the adhesive layers.

Further, while, in the embodiments described above, an adhesive is applied to the surface layer of only one of two polyimide multilayer wiring layers to be adhered to each other, it may otherwise be applied to the surface layers of the two polyimide multilayer wiring layers in order to reduce a possible influence of convex and concave profiles of the surfaces to be adhered Further, while, in the first, second and third embodiments, a polyimide multilayer wiring layer is formed on a ceramic board, the ceramic board may be replaced by, for example, a hard organic resin board such as a molded board of a polyimide resin. In this instance, signal input/output pins are forced into through-holes formed in the polyimide resin molded board. A polyimide multilayer wiring substrate which employs the polyimide resin molded board is particularly suitable for the manufacture of a large area high layering density wiring substrate because it is possible for the polyimide resin molded board as a base board and the polyimide multilayer wiring layers having wiring layers to have coefficients of thermal expansion adjusted to be accurately equal to each other.

Where the methods described above are employed, when a polyimide multilayer wiring substrate having a high layer number and a high wiring density is to be formed, a board on which a layered structure is supported can be separated readily.

As described above, according to the present invention, in order to manufacture a multilayer wiring substrate having polyimide multilayer wiring layers, an adhesive layer on polyimide multilayer wiring layers in which polyimide multilayer wirings are formed and the surface of a polyimide wiring layer on another polyimide multilayer wiring layers formed on a ceramic board are aligned and stacked on one another, and then they are pressurized and heated to adhere the surface of the adhesive layer on the polyimide multilayer wiring layer in which the polyimide multilayer wirings are formed to the surface of the polyimide of the polyimide multilayer wiring layers formed on the ceramic board by means of an adhesive, whereupon metal bumps on the two layered structures are adhered to each other to establish electric connection between the layered structures. Then, the flat board for supporting the polyimide multilayer wiring layers at the time of their formation is separated from the polyimide multilayer wiring layers. Consequently, there is an effect that a polyimide multilayer wiring substrate having a high layer number and a high wiring density can be formed in a very short period of manufacturing time in comparison with the conventional sequential layering method.

As described above, the method has been proposed wherein a polyimide multilayer wiring layer is formed by successively adhering a plurality of blocks each consisting of a layered structure including a plurality of wiring layers and dissolving, each time one block is adhered, a base material such as aluminum using hydrochloric acid as occasion calls. The problem described above of the method that wiring lines are invaded by the liquid for dissolving the base material can be offset by the present invention.

Subsequently, a fourth embodiment of the present invention is described with reference to the drawings.

FIGS. 29-46 show the fourth embodiment of a method for manufacturing a polyimide multilayer wiring substrate of the present invention in the order of steps. In a polyimide multilayer wiring substrate according to the present embodiment, the thickness of a wiring interlayer insulation layer is 20 $\mu$m; the width of a signal wiring is 25 $\mu$m; and thickness of a signal wiring film is 10 $\mu$m, and a photosensitive polyimide having low thermal expansion coefficient is employed as polyimide resin serving as interlayer insulation material while polyimide resin having a glass transition point is employed for adhesive layers and gold is employed as wiring metal.

First, a set of signal wiring layers and a grounding and connecting layer are formed on a flat plate of Pyrex glass (hereinafter referred to simply as glass flat plate) of a thickness of 2 mm by the following method.

(1) Solid layer 2' of polyimide of low thermal expansion is formed on a glass flat board 29. (FIG. 1')

Figure 30:
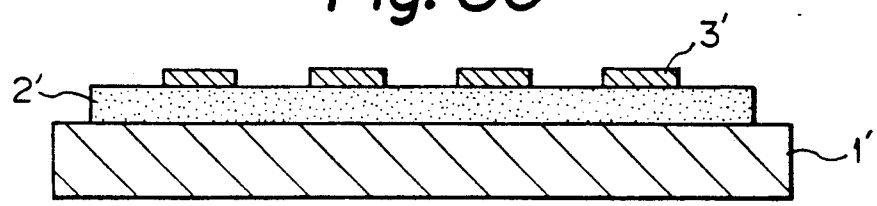

(2) Grounding and connecting wiring layers 3 are formed on the glass flat board 1' by patterning by photolithography using a photoresist and by electrolytic gold plating. (FIG. 30)

(3) Photosensitive polyimide varnish 4' is applied to glass flat board 1' on which grounding and connecting layers 3 are formed in the step (2), and then, exposure and development are performed to form viaholes 5' at predetermined positions in the insulation layer of polyimide varnish 4', thereafter curing is performed. (FIG. 31)

Figure 32:
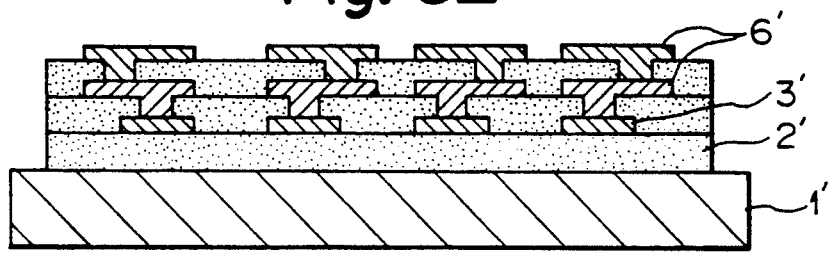

(4) A set of signal wiring layers 6' are formed using photosensitive polyimide as interlayer insulation. In the formation, signal wiring layers 6' are formed by the method in which grounding and connecting layer 3' is formed in the step (2), and then a signal interlayer insulation layer is formed by the method in which the insulation layer is formed in the step (3). (FIG. 32)

Figure 33:
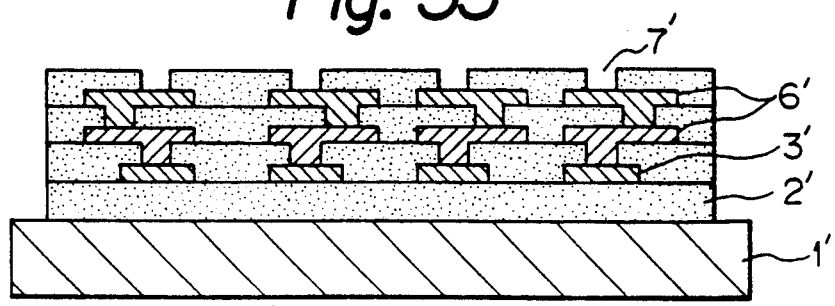

(5) Polyimide varnish is applied to the signal wiring layers 6' formed in the step (4), and exposure and development are performed to form viaholes 7' at predetermined positions in the layer of the polyimide varnish, thereafter curing is performed. (FIG. 33)

Figure 34:
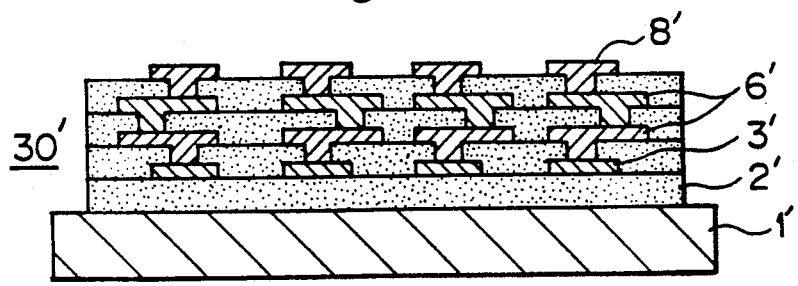

(6) Connecting bumps 8' are formed in the uppermost layer of the multilayer wiring layer, in which a required number of layers are formed in the step (5), at positions at which electric connection is established to a multilayer wiring layer to be formed in the steps in steps (7)–(13). The bumps 8' are formed by patterning by photography using a photoresist and by electrolytic gold plating. The thickness of the plated layer of gold is 10 $\mu$m. In this manner, a first layered structure 30' is formed. (FIG. 34)

Subsequently, a set of signal wiring layers and a set of grounding and connecting layers which hold the signal wiring layers therebetween are formed on a ceramic board 10' in the manner as described below.

Figure 35:
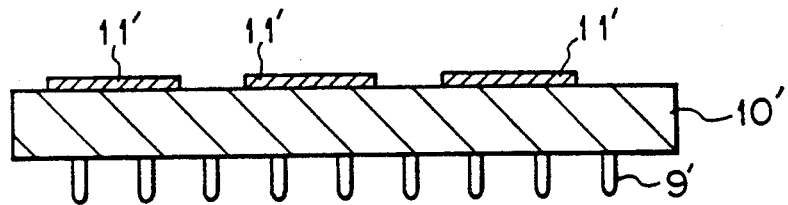

(7) Grounding and connecting wiring layer 11' is formed on ceramic board 10', which has signal input-/output pins and power source pins 9' provided on the rear face thereof, by patterning by photolithography using a photoresist and by electrolytic gold plating. (FIG. 35)

Figure 36:
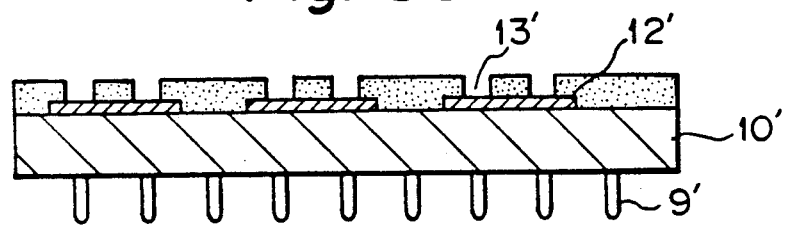

(8) Photosensitive polyimide varnish 12' is applied to the grounding and connecting layers 11' formed in step (7) and exposure and development are performed to form viaholes 13' at predetermined positions in the insulation layer of polyimide varnish 12', thereafter curing is performed. (FIG. 36)

Figure 37:
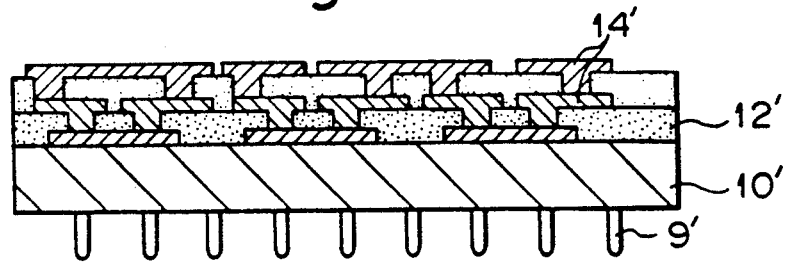

(9) A set of signal wiring layers 14' and interlayer insulation of photosensitive polyimide are formed. The forming method is such that signal wiring layers 14' are formed by the method in which grounding and connecting layer 3' is formed in the step (2), and then a signal interlayer insulation layer is formed by the method in which the insulation layer is formed at the step (3). (FIG. 37)

Figure 38:
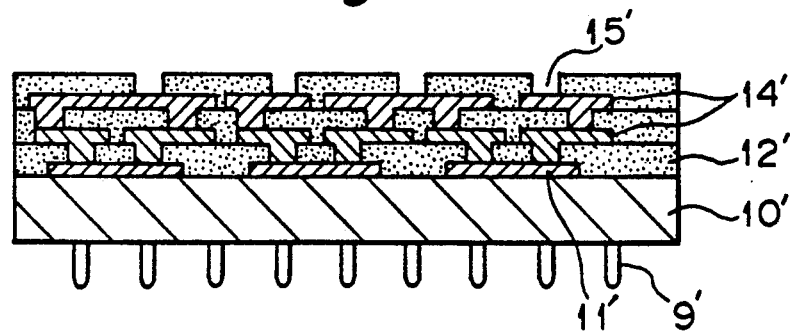

(10) Photosensitive polyimide varnish is applied to the uppermost layer of the signal wiring layers' 14' and exposure and development are performed to form viaholes 15' at predetermined positions in the layer of the polyimide varnish, thereafter curing is performed. (FIG. 38)

Figure 39:
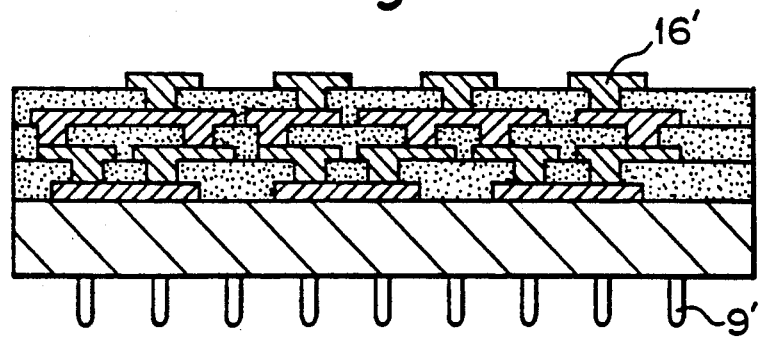

(11) Second grounding and connecting layers 16' is formed on the photosensitive polyimide varnish formed in the step (10) by the method used in the step (7). (FIG. 39)

Figure 40:
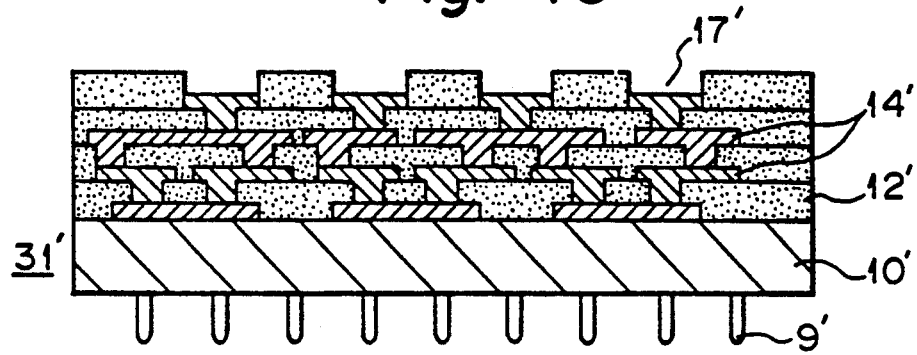
Figure 41:
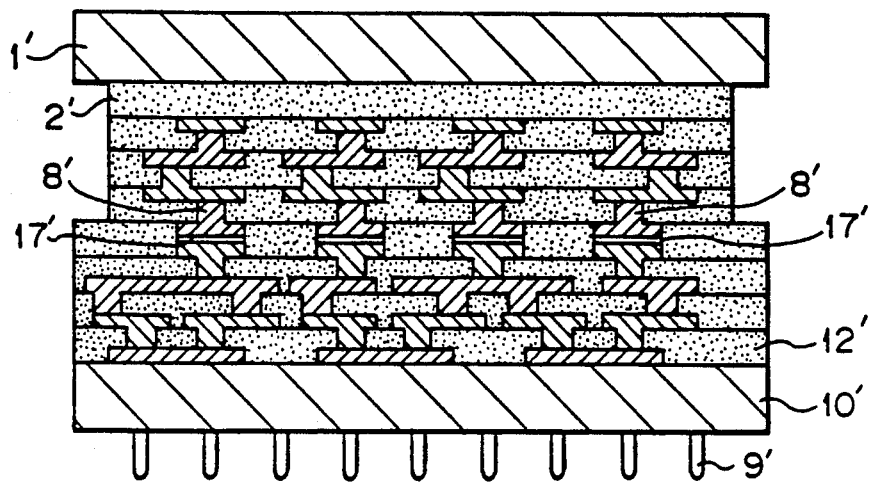

(12) As illustrated in FIG. 40, a polyimide layer including viaholes 17' serving as metal electrodes for electric connection with the layered structure 30' is formed over the second grounding and connecting layers 16' in a manner similar to the step (8) to form a layered structure 31'.

(13) The polyimide layer including connection bumps 8' of the layered structure 30' formed in the processes (1)-(6) and the polyimide layer including viaholes 17' formed in the uppermost layer of the layered structure 31' formed in the process (7)-(12) are aligned with each other and pressed to each other and then heated to a temperature above a glass transient temperature of polyimide resin, whereby the uppermost layer of the structure 30' and that of the structure 31' are bonded and fixed to each other and at the same time the viaholes 17' and metal trumps 8' are joined to each other by being melted by heat, causing thereby both the structures 30', 31' to be electrically connected. The pressing and heating is effected by means of an autoclave type vacuum press under condition of 350° C., 14 kg/cm² for 60 minutes using nitrogen as pressurization gas, during which the substrate is placed on a platen and sealed by means of a polyimide film and the interior of the film is kept vacuum (see FIG. 41).

Figure 42:
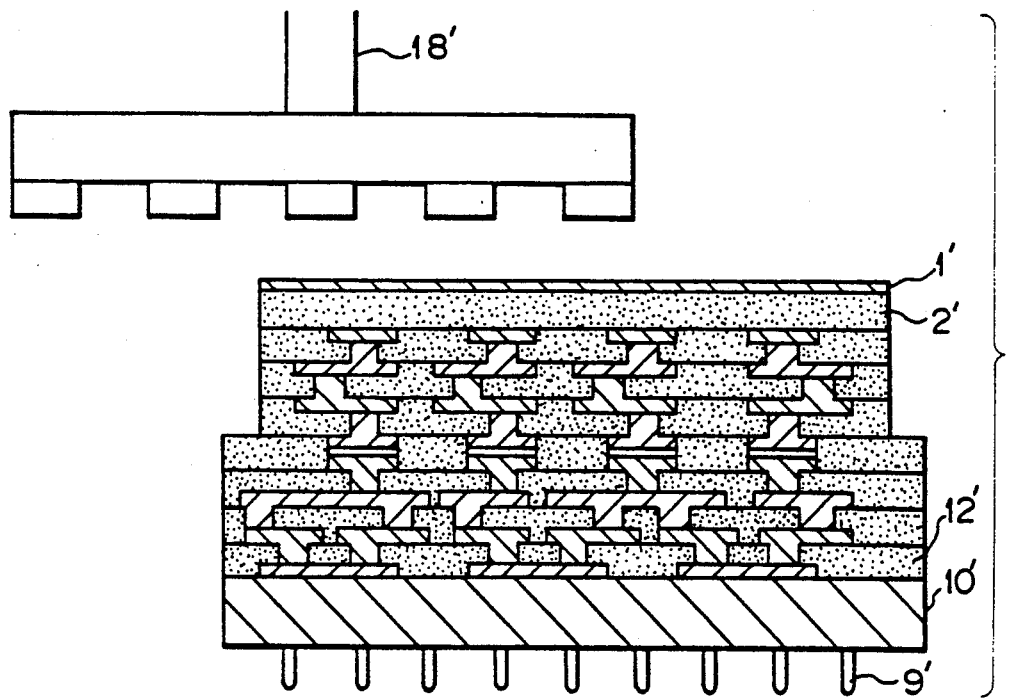

(14) As shown in FIG. 42, the flat board 1' of the layered structures 30, 31' is cut by a cutting machine 18' to a thickness about 100 μm.

Figure 43:
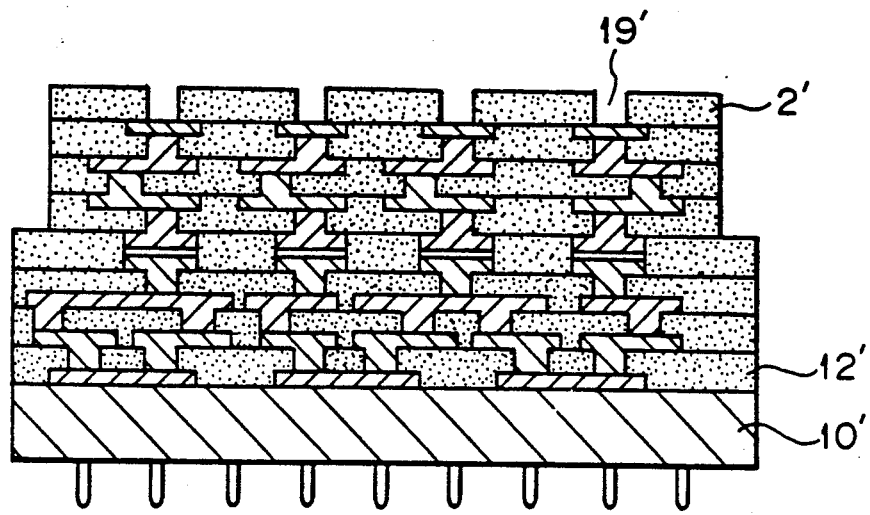

(15) As shown in FIG. 43, the flat board 1' is dissolved and removed using hydrofluoric acid to expose the polyimide layer 2' of low thermal expansion. By applying dry etching process to the layer 2', viaholes 19' are formed at specified positions.

Figure 44:
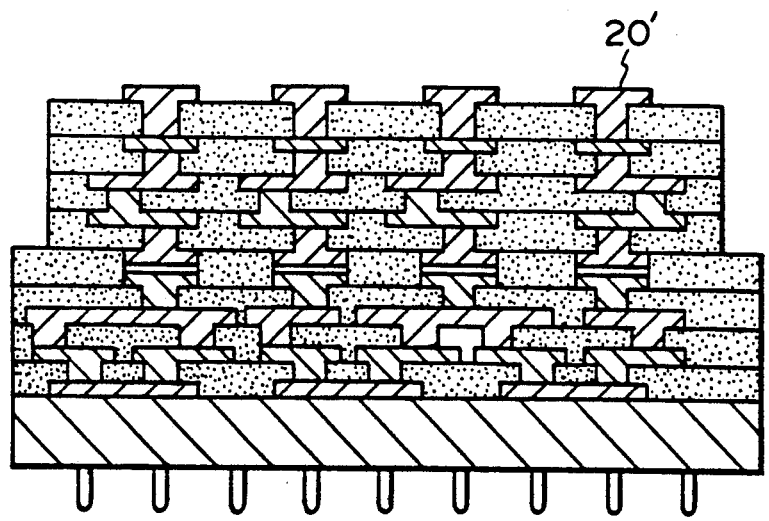

(16) Gold bumps 20', as metal electrodes are formed by the same method as the process (2) as shown in FIG. 44.

Figure 45:
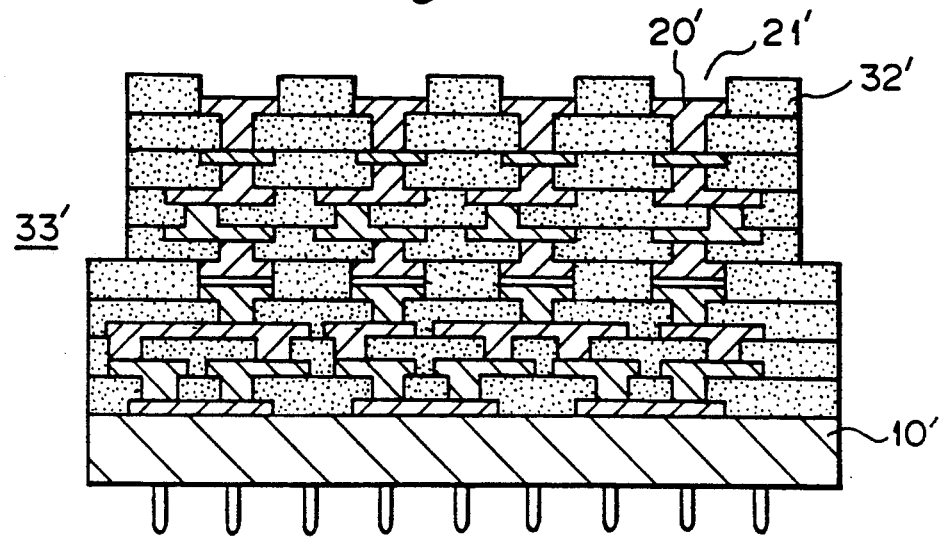
Figure 46:
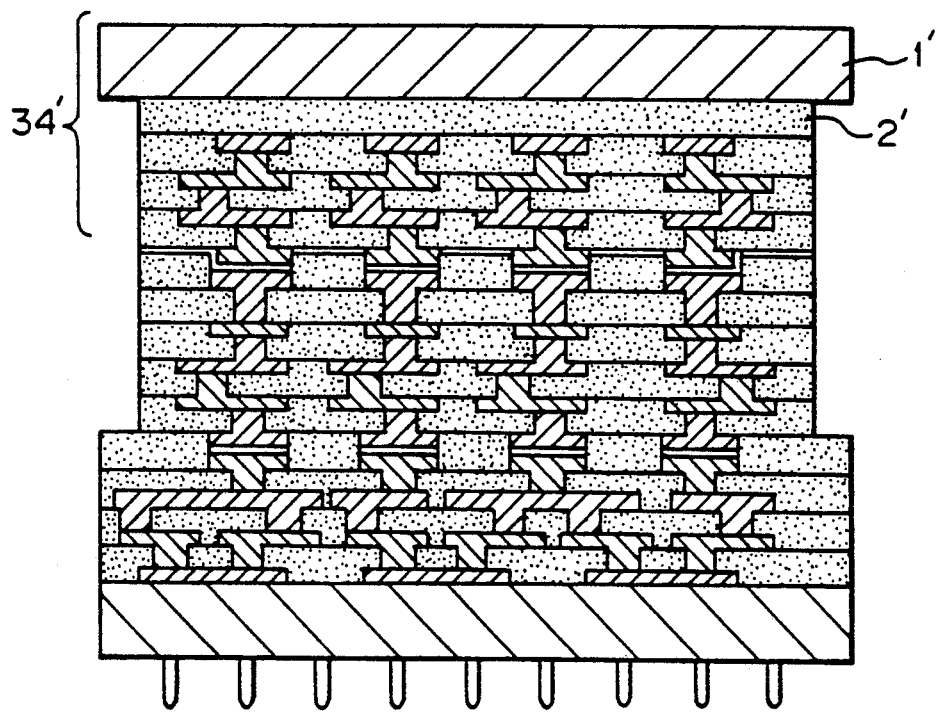

(17) As shown in FIG. 45, a polyimide layer 32', in which viaholes 21' are provided by the same method as the process (2), is formed on the gold bumps 20' to provide a layered structure 33'. As illustrated in FIG. 46, another layered structure 34' formed by the processes (1)-(6) is stacked on the structure 33' by aligning the via holes 21' with the bumps 8' by the same method as the process (13). Further, if required, processes (14)-(17) are applied to the flat board 1' of the structure 34' to superpose another structure 30' thereon, which processes are repeated until wiring layers of required number are provided.

In the above mentioned embodiment, electrical connection between the layered structures 30', 31' is established by using the bumps 8' and viaholes 17', 21', whereas gold-tin pools, as metal electrodes, may be formed in the viaholes 17', as shown in FIG. 17', to join said pools with the bumps 8'. The pressurizing and heating method for joining the structures 30', 31' using the gold-tin pools and bumps 8' is carried out in the same manner as in the process (13) under conditions of 3 kg/cm² up to substrate temperature 250° C., 14 kg/cm² at 250°-350° C. using an autoclave vacuum press device wherein nitrogen is used.

The method for forming gold-tin pools is such that patterning is made by photolithography using photoresist and embedding printing is carried out using photoresist as a mark. Further, a solder layer may be formed over a metal pad to join said layer with a metal pad.

Instead of the glass board 1' of the structure 30', aluminum, alumina can also be used. For example, in the case of aluminum flat board, the board is cut to a thickness of about 50 μm using a cutter instead of cutting by means of the cutting machine 18', as etching liquid, hydrochloric acid (HCL) may be employed to remove remaining aluminum board to expose polyimide 2' and then process (15) and following processes are carried out to form the structure 33'. In this manner, gold-tin pools are formed in the viaholes 21' of structures 33' having required number of layers to form pad for connection with LSI on said pools. Said pads can be formed by the method in process (2) in which grounding and connecting layers are formed. In the foregoing descriptions, the thickness of the aluminum board 1' is specified as 50 μm, however, said value has been determined taking into account of amount of warp of board and cutting accuracy, therefore said thickness can be specified depending on amounts of warp and cutting accuracy. However, thickness of 200 μm or less is preferable to produce the effect of the present invention.

For a ceramic board 10', glass ceramics, enameled steel plate or hard organic resin board, e.g. board made of polyimide resin, can be used. In this case, input/output pins 9' are struck into through holes formed in a polyimide resin board. A polyimide multilayer wiring substrate using said board, in which thermal expansion coefficients of the resin board constituting a base and polyimide wiring layers can be precisely equalized, is suitable for manufacturing large-area wiring substrate of large number of layers. It is desirable to select polyimide resin and board so that differences in thermal expansion coefficients thereof can be made as small as possible. In the case of the embodiment according to the invention wherein pyrex is used, thermal expansion coefficient of polyimide resin is desired to be $10^{-5} Deg^{-1}$ or less.

Further, metal of low resistance such as copper may be used for the metal wiring material as shown above. As material for adhesive layer, in addition to polyimide layer in the embodiment, melt hardening maleimide resin, melt fluorine film, e.g. PEA (copolymer of ethylene fluoride and perfluoroalkyl perfluorovinyl ether), may be used. When the structures 30', 31' are superposed and bonded, the uppermost surface of at least one of them may be coated with adhesives to reduce effects of irregularities of the surface.

As described above, since a polyimide multilayer wiring substrate is formed by superposing separately formed polyimide layered structures to bond them to each other, removing a base of one of the structures by etching it after cutting it, and superposing another layered structure on said base, improvement in manufacturing yield, shorter manufacturing period and prevention of corrosion of wires due to etching liquid can be achieved.

As described above, according to the method for manufacturing a polyimide multilayer substrate, a flat board made of aluminum, glass, silicone etc., as a supporting board for layered structures is cut by means of a grinding or cutting machine and thereafter removed using etching liquid, so that the supporting board can be easily separated.

Consequently, a polyimide multilayer wiring substrate with high multilayer wiring density can be manufactured in a largely shorter period of time in comparison with a conventional method. Since the time it takes for a board of glass etc., to be dipped in solutions such as hydrofluoric acid can be made shorter, wires are prevented from being corroded by the solution and hence wiring boards having high reliability can be obtained.

It is to be understood that variations and modifications of the method for manufacturing a polyimide multilayer wiring substrate disclosed herein will be evident to those skilled in the art. It is intended that all such modifications and variations be included within the scope of the appended claims.

What is claimed is:

1. A method for manufacturing a polyimide multilayer wiring substrate, including the steps of:
   (1) forming a first layered structure consisting of one or more wiring layers and one or more polyimide layers as an interlayer insulating material on a first board, the surface of said first board being divided into an outer peripheral surface and an inner surface surrounded by the outer peripheral surface, wherein adhesiveness to polyimide of the former surface is made high, whereas that of the latter is made nearly zero,
   (2) forming on a second board a second layered structure consisting of one or more wiring layers and one or more polyimide layers as an interlayer insulating material,
   (3) aligning metal bumps, which are formed on the surface of the first layered structure and electrically connected to the wirings in the first layered structure, with metal bumps, which are formed on the surface of the second layered structure and electrically connected to the wirings in the second layered structure, pressing an adhesive layer formed on the surface of the first layered structure against an adhesive layer formed on the surface of the second layered structure and heating both the adhesive layers to bond said layers to each other, thereby establishing electric connection between the metal bumps on the first and second layered structures,
   (4) cutting off the outer peripheral portion of the first layered structure to remove the first board, and
   (5) forming viaholes in the polyimide layer having been exposed in the fourth step.

2. A method for manufacturing a polyimide multilayer wiring substrate as claimed in claim 1, wherein the first board comprises a hard flat plate of aluminum, alumina, or silicone, while the first polyimide layer in contact with the first board and the second polyimide layer formed on the first polyimide layer are formed from polyimide having a low thermal expansion coefficient, and the first polyimide layer is formed only over the inner surface of the first board and the adhesive layers formed on the surfaces of the first and second layered structures are made of polyimide having a glass transition point.

3. A method for manufacturing a polyimide multilayer wiring substrate as claimed in claim 1, wherein the first board comprises a single crystal plate of alumina and has a deposited film of titanium, chromium, tungsten, palladium or platinum formed on the surface of the outer periphery of the first board, and the adhesive layer for the deposited film is made of polyimide having a glass transition point.

4. A method for manufacturing a polyimide multilayer wiring substrate as claimed in claim 1, wherein the first board is a hard flat plate of aluminum, alumina, or silicone, and electroless nickel plating is applied onto the inner surface of the first board.

5. A method for manufacturing a polyimide multilayer wiring substrate, including the steps of:
   (1) forming a first layered structure, wherein an uppermost layer of polyimide multilayer wiring layers formed by stacking at least one wiring layer and at least one polyimide layer, as interlayer insulating material, on a board is made of polyimide resin, and a plurality of first metal electrodes are provided in said uppermost layer so as to make electric contact with said wiring layers,
   (2) forming a plurality of second layered structures, wherein an uppermost layer of polyimide multilayer wiring layers formed by stacking at least one wiring layer and at least one polyimide layer, as interlayer insulating material, on a flat hard board is an adhesive-agent layer, and a plurality of second metal electrodes are provided in said uppermost layer so as to make electric contact with said wiring layer,
   (3) superposing the upper, host layer of the first layered structure on the uppermost layer of one of said second layered structures, the first metal electrodes and the second metal electrodes being aligned with each other, thereafter pressing and heating both the structures to bond both the uppermost layers to each other, thereby joining said first and second metal electrodes to electrically connect said first and second layered structures,
   (4) partially removing said flat hard board of said second layered structure so as to leave behind a thin board on said structure, dissolving and removing said thin board with etching liquid to expose a polyimide layer, forming viaholes and metal electrodes in contact with internal wiring layer in said polyimide layer, and further superposing another second layered structure on said exposed layer in succession.

* * * * *

UNITED STATES PATENT AND TRADEMARK OFFICE
CERTIFICATE OF CORRECTION

PATENT NO. : 5,322,593
DATED : June 21, 1994
INVENTOR(S) : Shinichi Hasegawa et al It is certified that error(s) appears in the above-identified patent and that said Letters Patent is hereby corrected as shown below:

Column 3, line 33, delete "farming" and insert --forming--;

line 59, delete "on" and insert --one--.

Column 8, line 55, delete "18" and insert --15--.

Column 10, line 13, delete "ground" and insert --grounding--;

Column 11, lines 6 and 7, delete "19 (a) - (g)" and insert --20(a) - (f).

UNITED STATES PATENT AND TRADEMARK OFFICE
CERTIFICATE OF CORRECTION

PATENT NO. : 5,322,593
DATED : June 21, 1994
INVENTOR(S) : Shinichi Hasegawa et al It is certified that error appears in the above-indentified patent and that said Letters Patent is hereby corrected as shown below:

Column 16, line 50, delete "upper, host" and insert ---uppermost--

Signed and Sealed this

Fourth Day of April, 1995

Attest:

BRUCE LEHMAN

*Attesting Officer*    *Commissioner of Patents and Trademarks*